US012642137B2

(12) United States Patent
Yao et al.

(10) Patent No.: US 12,642,137 B2
(45) Date of Patent: May 26, 2026

(54) MULTI-LAYER CHIP ARCHITECTURE AND FABRICATION

(71) Applicant: Google LLC, Mountain View, CA (US)

(72) Inventors: Zhimin Jamie Yao, Santa Barbara, CA (US); Michael C. Hamilton, Auburn, AL (US); Marissa Giustina, Santa Barbara, CA (US); Brian James Burkett, Santa Barbara, CA (US); Theodore Charles White, Santa Barbara, CA (US); Ofer Naaman, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 580 days.

(21) Appl. No.: 18/080,729

(22) Filed: Dec. 13, 2022

(65) Prior Publication Data

US 2024/0194661 A1      Jun. 13, 2024

(51) Int. Cl.
H01L 25/00 (2006.01)
H01L 23/00 (2006.01)

(52) U.S. Cl.
CPC .............. H01L 25/50 (2013.01); H01L 24/81 (2013.01); H01L 24/13 (2013.01); *H01L 2224/13109* (2013.01); *H01L 2224/81815* (2013.01)

(58) Field of Classification Search
CPC ......... H01L 25/50; H01L 24/81; H01L 24/13; H01L 2224/13109
See application file for complete search history.

(56) References Cited

U.S. PATENT DOCUMENTS

| | | | | |
|---|---|---|---|---|
| 6,596,624 | B1 | 7/2003 | Romankiw | |
| 10,355,193 | B2 * | 7/2019 | Rosenblatt | .............. H01L 25/50 |
| 10,497,853 | B2 * | 12/2019 | Mutus | ................. H01L 25/0657 |
| 10,644,217 | B2 * | 5/2020 | Rosenblatt | .............. H01L 25/50 |
| 10,978,425 | B2 * | 4/2021 | White | ................. H01L 25/0657 |
| 11,133,450 | B2 * | 9/2021 | Mutus | ................. H01L 25/0657 |
| 11,133,451 | B2 * | 9/2021 | Mutus | ................. H01L 25/0657 |
| 11,428,661 | B2 * | 8/2022 | Haubold | ................. H01L 21/56 |
| 11,436,516 | B2 * | 9/2022 | Kelly | .................... G06N 10/40 |
| 11,569,205 | B2 * | 1/2023 | White | ............... H01L 25/0657 |
| 11,854,833 | B2 * | 12/2023 | Jeffrey | .................... G06N 10/40 |
| 11,955,465 | B2 * | 4/2024 | White | ................. H01L 25/0657 |

(Continued)

FOREIGN PATENT DOCUMENTS

| | | | |
|---|---|---|---|
| AU | 2018434686 A1 * | 12/2020 | ........... H10H 20/812 |
| AU | 2018434686 B2 * | 12/2021 | ........... H10H 20/812 |

(Continued)

OTHER PUBLICATIONS

International Search Report and Written Opinion in International Appln. No. PCT/US2023/083313, mailed on Jun. 14, 2024, 24 pages.

(Continued)

*Primary Examiner* — Laura M Menz
(74) *Attorney, Agent, or Firm* — Fish & Richardson P.C.

(57) ABSTRACT

A method includes providing a first chip having a circuit element layer stack, the circuit element layer stack including a plurality of circuit elements distributed across a plurality of layers. The circuit element layer stack has a sacrificial material filling a space between the plurality of circuit elements in the plurality of layers and a coherent device layer disposed on the circuit element layer stack. The method includes removing the sacrificial material.

15 Claims, 8 Drawing Sheets

(56) References Cited

U.S. PATENT DOCUMENTS

| | | | | |
|---|---|---|---|---|
| 12,033,029 | B2 * | 7/2024 | Kelly | G06N 10/40 |
| 12,217,129 | B2 * | 2/2025 | Kelly | G06N 10/40 |
| 2007/0275502 | A1 | 11/2007 | George et al. | |
| 2011/0133342 | A1 * | 6/2011 | Arai | H01L 21/76898 |
| | | | | 257/E21.597 |
| 2018/0013052 | A1 * | 1/2018 | Oliver | H10N 60/805 |
| 2018/0366634 | A1 * | 12/2018 | Mutus | H01L 25/0657 |
| 2019/0097339 | A1 * | 3/2019 | Lim | H01R 12/772 |
| 2019/0165238 | A1 * | 5/2019 | Rosenblatt | H01L 25/50 |
| 2019/0165241 | A1 * | 5/2019 | Rosenblatt | H01L 25/50 |
| 2019/0181168 | A1 | 6/2019 | Kawashima | |
| 2019/0229094 | A1 * | 7/2019 | White | H01L 25/0657 |
| 2020/0006620 | A1 * | 1/2020 | Mutus | H01L 25/0657 |
| 2020/0006621 | A1 * | 1/2020 | Mutus | H01L 25/0657 |
| 2020/0012961 | A1 * | 1/2020 | Kelly | G06N 10/40 |
| 2021/0175095 | A1 * | 6/2021 | Jeffrey | H01L 23/49822 |
| 2021/0233896 | A1 * | 7/2021 | White | H01L 25/0657 |
| 2022/0020715 | A1 * | 1/2022 | Lewandowski | G06N 10/00 |
| 2023/0004847 | A1 * | 1/2023 | Kelly | G06N 10/40 |
| 2023/0004848 | A1 * | 1/2023 | Kelly | G06N 10/40 |
| 2023/0178519 | A1 * | 6/2023 | White | H01L 25/0657 |
| | | | | 257/662 |
| 2024/0071944 | A1 * | 2/2024 | Jenei | H01L 23/544 |
| 2024/0162050 | A1 * | 5/2024 | Jeffrey | H01L 21/4857 |
| 2024/0194532 | A1 * | 6/2024 | Yao | H10D 84/038 |
| 2024/0194661 | A1 * | 6/2024 | Yao | H01L 25/50 |
| 2025/0245538 | A1 * | 7/2025 | Kelly | G06N 10/40 |

FOREIGN PATENT DOCUMENTS

| | | | | | |
|---|---|---|---|---|---|
| CA | 3102773 | A1 | * | 2/2020 | H10H 20/812 |
| CA | 3102773 | C | * | 5/2023 | H10H 20/812 |
| CN | 112313796 | A | * | 2/2021 | H10H 20/812 |
| CN | 116419660 | A | * | 7/2023 | G06N 10/00 |
| CN | 112313796 | B | * | 12/2023 | H10H 20/812 |
| CN | 109891591 | B | * | 1/2024 | H10N 60/01 |
| CN | 117790459 | A | * | 3/2024 | H10H 20/812 |
| CN | 117915758 | A | * | 4/2024 | H10N 60/01 |
| DE | 102018220169 | A1 | * | 5/2020 | H01L 21/52 |
| WO | WO-2016182571 | A1 | * | 11/2016 | H01L 23/49827 |
| WO | WO-2017105524 | A1 | * | 6/2017 | H01L 23/49816 |
| WO | WO-2018052399 | A1 | * | 3/2018 | H01L 24/05 |
| WO | WO-2018169585 | A1 | * | 9/2018 | H01L 25/0657 |
| WO | WO 2019132963 | | | 7/2019 | |
| WO | WO-2020027779 | A1 | * | 2/2020 | H01L 23/49822 |
| WO | WO-2023124666 | A1 | * | 7/2023 | G06N 10/00 |
| WO | WO-2024129567 | A2 | * | 6/2024 | G06N 10/40 |

OTHER PUBLICATIONS

Invitation to Pay Additional Fees in International Appln. No. PCT/US2023/083313, mailed on Apr. 24, 2024, 18 pages.

O'Connell et al., "Microwave dielectric loss at single photon energies and millikelvin temperatures." Applied Physics Letters 92.11, Mar. 2008, 112903:1-3.

International Preliminary Report on Patentability in International Appln. No. PCT/US2023/083313, mailed on Jun. 26, 2025, 16 pages.

Wang et al., "Fabrication of single-mode ridge SU-8 waveguides based on inductively coupled plasma etching." Applied Physics A 113.1, Oct. 2013, 195-200.

* cited by examiner

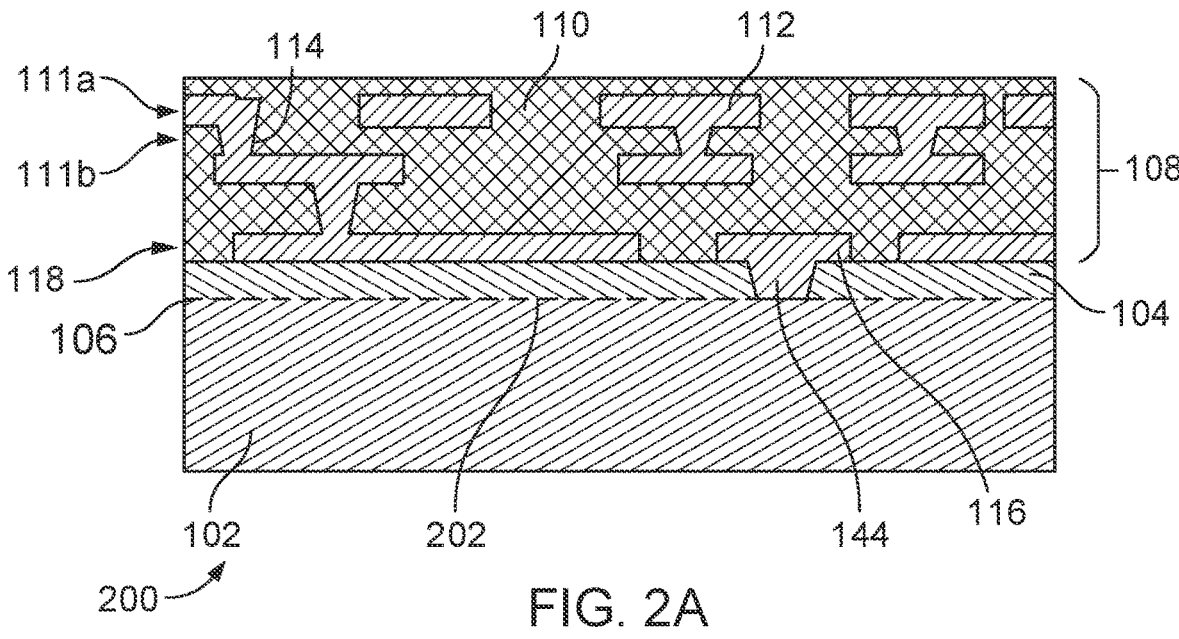
FIG. 2A
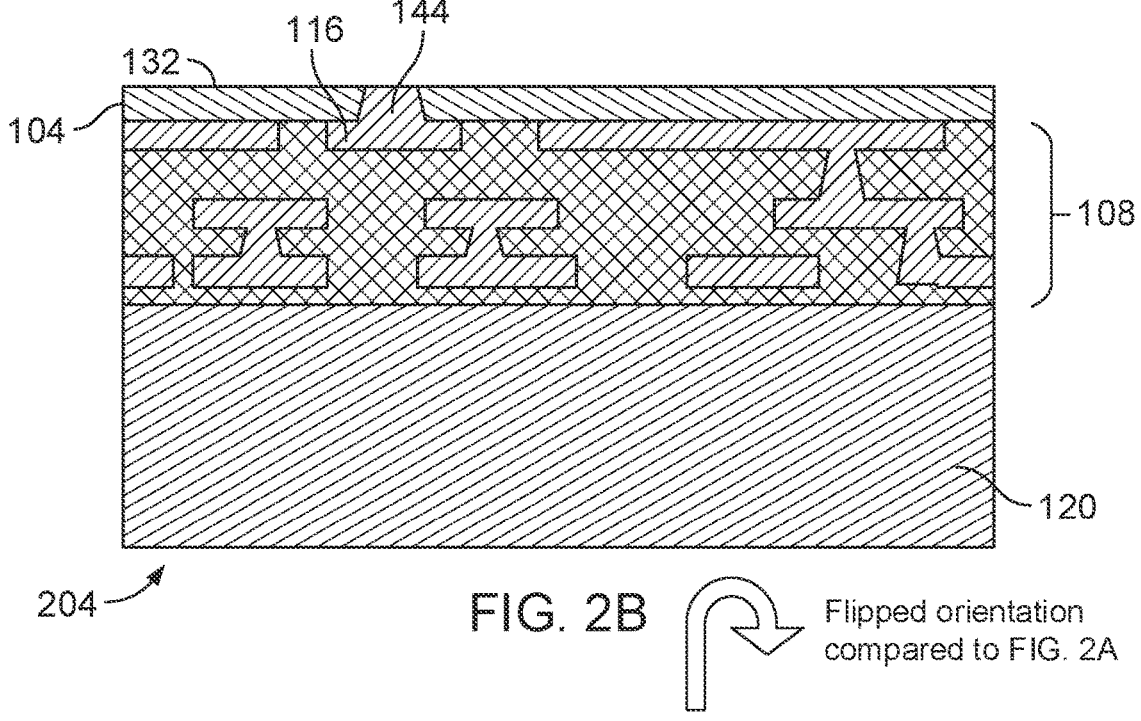
FIG. 2B     Flipped orientation compared to FIG. 2A

1

MULTI-LAYER CHIP ARCHITECTURE AND FABRICATION

FIELD OF THE DISCLOSURE

The present disclosure relates to fabrication processes for chips including circuit elements.

BACKGROUND

Chips for electronics and computing applications, such as quantum computing applications, can include multiple layers. The multiple layers can include devices coupled to wiring.

SUMMARY

Some aspects of this disclosure describe a method. The method includes providing a first chip having a circuit element layer stack, the circuit element layer stack including a plurality of circuit elements distributed across a plurality of layers. The circuit element layer stack has a sacrificial material filling a space between the plurality of circuit elements in the plurality of layers and a coherent device layer disposed on the circuit element layer stack. The method includes removing the sacrificial material.

Implementations of this and other described methods can have one or more of at least the following characteristics.

In some implementations, the method includes bonding the first chip to a second chip in a flip-chip configuration.

In some implementations, the first chip is bonded to the second chip at a bond point, and the circuit element layer stack includes a first mechanical support structure aligned with the bond point, the first mechanical support structure extending vertically through two or more layers of the circuit element layer stack.

In some implementations, the circuit element layer stack includes a second mechanical support structure extending vertically through two or more layers of the circuit element layer stack. The second mechanical support structure is not aligned with any bond point between the first chip and the second chip. The first mechanical support structure is wider than the second mechanical support structure.

In some implementations, the first chip includes a qubit control element or a qubit readout element on the coherent device layer. The second chip includes a qubit configured to couple to the qubit control element or the qubit readout element.

In some implementations, the circuit element layer stack includes a mechanical support structure extending vertically through two or more layers of the circuit element layer stack. The mechanical support structure has a lateral dimension between 5 μm and 60 μm.

In some implementations, the first chip includes a substrate on which the circuit element layer stack is disposed, and the mechanical support structure extends from a surface of the substrate.

In some implementations, the mechanical support structure extends from the surface of the substrate to the coherent device layer.

In some implementations, the plurality of circuit elements include a first circuit element in a layer of the circuit element layer stack immediately below the coherent device layer, and the mechanical support structure extends from the surface of the substrate to the first circuit element.

In some implementations, the mechanical support structure is a single column extending vertically through the two or more layers.

In some implementations, the mechanical support structure is composed of a dielectric material.

In some implementations, the coherent device layer is a monocrystalline silicon layer.

In some implementations, providing the first chip includes forming a passivation layer on one or more surfaces of the plurality of circuit elements.

In some implementations, the passivation layer includes a noble metal, and the passivation layer is formed prior to removing the sacrificial material.

In some implementations, the passivation layer includes an organic material.

In some implementations, the organic material is a low-loss organic material, and the passivation layer is formed by vapor deposition subsequent to removing the sacrificial material.

In some implementations, the passivation layer is formed prior to removing the sacrificial material, and the method includes, subsequent to removing the sacrificial material, removing the passivation layer.

In some implementations, removing the sacrificial material includes selectively etching the sacrificial material using a wet-chemical etch or a gaseous etch.

In some implementations, the plurality of circuit elements include superconductor wiring.

In some implementations, the sacrificial material is an oxide, a nitride, or an oxynitride.

In some implementations, the coherent device layer has a dielectric loss tangent for microwave frequencies of less than $10^{-4}$.

In some implementations, the circuit element layer stack includes a thermalization structure composed of one or more non-superconductor metals.

Some aspects of this disclosure describe another method. The method includes providing a first chip having a plurality of circuit elements distributed across a plurality of layers, a sacrificial material filling a space between the plurality of circuit elements in the plurality of layers, and a mechanical support structure extending vertically through at least two layers of the plurality of layers. The method includes removing the sacrificial material.

Some aspects of this disclosure describe another method. The method includes providing a first chip having a plurality of circuit elements distributed across a plurality of layers, and a sacrificial material filling a space between the plurality of circuit elements in the plurality of layers. The method includes removing the sacrificial material, and bonding the first chip to a second chip in a flip-chip configuration.

Some aspects of this disclosure describe an apparatus. The apparatus includes a first chip. The first chip includes a substrate and a circuit element layer stack disposed on the substrate, the circuit element layer stack including a plurality of circuit elements distributed across a plurality of layers. A space between the plurality of circuit elements includes a vacuum. The first chip includes a coherent device layer disposed on the circuit element layer stack.

This and other described apparatuses can have one or more of at least the following characteristics.

In some implementations, the apparatus includes a second chip bonded to the first chip at a bond point in a flip-chip configuration. The circuit element layer stack includes a first mechanical support structure aligned with the bond point, the first mechanical support structure extending vertically through two or more layers of the circuit element layer stack.

In some implementations, the circuit element layer stack includes a second mechanical support structure extending vertically through two or more layers of the circuit element layer stack. The second mechanical support structure is not aligned with any bond point between the first chip and the second chip, and the first mechanical support structure is wider than the second mechanical support structure.

In some implementations, the first chip includes a qubit control element or a qubit readout element on the coherent device layer. The second chip includes a qubit configured to couple to the qubit control element or the qubit readout element.

In some implementations, the first mechanical support structure has a lateral dimension between 5 µm and 60 µm.

In some implementations, the first mechanical support structure extends from a surface of the substrate.

In some implementations, the first mechanical support structure extends from the surface of the substrate to the coherent device layer.

In some implementations, the plurality of circuit elements includes a first circuit element in a layer of the circuit element layer stack immediately below the coherent device layer. The first mechanical support structure extends from the surface of the substrate to the first circuit element.

In some implementations, the first mechanical support structure is a single column extending vertically through the two or more layers.

In some implementations, the first mechanical support structure is composed of a dielectric material.

In some implementations, the coherent device layer is a monocrystalline silicon layer.

In some implementations, the circuit element layer stack includes a passivation layer on one or more surfaces of the plurality of circuit elements.

In some implementations, the passivation layer includes a noble metal.

In some implementations, the passivation layer includes an organic material.

In some implementations, the plurality of circuit elements include superconductor wiring.

In some implementations, the coherent device layer has a dielectric loss tangent for microwave frequencies of less than $10^{-4}$.

In some implementations, the circuit element layer stack includes a thermalization structure composed of one or more non-superconductor metals.

Some aspects of this disclosure describe another method. The method include providing a first substrate having a first layer on a surface of the first substrate, and forming a circuit element layer stack on a first surface of the first layer. The circuit element layer stack includes a plurality of circuit element layers, and the plurality of circuit element layers include a plurality of circuit elements. The method includes bonding a second substrate to a surface of the circuit element layer stack, removing the first substrate to expose a second surface of the first layer, the second surface being on an opposite side of the first layer from the first surface, and forming a device on the second surface of the first layer.

This and other described methods can have one or more of at least the following characteristics.

In some implementations, the second substrate, the circuit element layer stack, the first layer, and the device are included in a first chip, and the method includes bonding a second chip to the first chip with the device facing the second chip, wherein the device is separated from the second chip by a gap.

In some implementations, the device includes a qubit control element or a qubit readout element, and the second chip includes a qubit arranged to couple to the qubit control element or the qubit readout element.

In some implementations, the first layer has a dielectric loss tangent for microwave frequencies of less than $10^{-4}$.

In some implementations, the first layer is a monocrystalline silicon layer.

In some implementations, the method includes forming a via through the first layer, the via electrically coupling the device to a first circuit element of the plurality of circuit elements.

In some implementations, forming the via through the first layer includes, subsequent to removing the first substrate, forming an aperture in the first layer; and forming the via in the aperture.

In some implementations, forming the via through the first layer includes, prior to bonding the second substrate to the surface of the circuit element layer stack: forming an aperture in the first layer from the first surface of the first layer, and forming the via in the aperture.

In some implementations, bonding the second substrate to the surface of the circuit layer stack includes forming a first metal layer on a surface of the second substrate; forming a second metal layer on the surface of the circuit layer stack; and bonding the first metal layer to the second metal layer.

In some implementations, the first substrate includes a dielectric layer between the surface of the first substrate and the first layer, and removing the first substrate further includes removing the dielectric layer.

In some implementations, the dielectric layer is silicon oxide.

In some implementations, the first substrate is a silicon substrate, and the first layer is a monocrystalline silicon layer.

In some implementations, removing the first substrate includes etching the first substrate.

In some implementations, the method includes, prior to bonding the second substrate to the surface of the circuit element layer stack, planarizing the surface of the circuit element stack.

In some implementations, the method includes transferring a structure including the circuit element stack, the first layer, and the second substrate from a first fabrication tool to a second fabrication tool or within a fabrication tool. Transferring the structure includes contacting the second substrate.

In some implementations, the plurality of circuit elements and the device include one or more superconductor materials.

In some implementations, the circuit element layer stack includes a filler material filling a space between the plurality of circuit elements.

Some aspects of this disclosure describe devices and structures. For example, this disclosure describes devices and structures formed by any of the above methods, and further includes devices and structures illustrated in the accompanying drawings.

The details of one or more implementations are set forth in the accompanying drawings and the description below. Other aspects, features and advantages will be apparent from the description and drawings, and from the claims.

BRIEF DESCRIPTION OF THE DRAWINGS

FIGS. 2A-2B are schematics illustrating an example of a chip fabrication process.

DETAILED DESCRIPTION

This disclosure relates to fabrication processes for forming computing chips, such as chips for use in quantum computing. Several promising candidate technologies for the physical realization of a quantum computer often rely on fabrication techniques used in classical integrated circuit manufacturing. However, in some cases, design requirements of quantum computers can render existing fabrication methods and chip designs unsuitable.

For instance, quantum computing circuit elements (also referred to as quantum circuit elements, structures, or devices), such as qubits and qubit measurement resonators, among others, rely on low-loss reactive microwave components and dielectrics to achieve a high quality factor, Q. In some cases, however, the materials used to fabricate the devices may introduce parasitic loss mechanisms (such as parasitic two-level systems), and thus are not suitable for high coherence/low decoherence quantum circuit elements. These so-called "lossy" materials may dominate dissipation in the system causing, e.g., qubit decoherence through field coupling, and thus limiting the performance of quantum circuit elements. Additionally, in some implementations, loss mechanisms can be associated with device heating, which may increase the device temperature to above a desired temperature, e.g., associated with loss of superconductivity or decreased coherence. Moreover, structures that satisfy one or more design or operational constraints may be associated with fabrication processes that can be incompatible with fabrication of other structures. Implementations according to this disclosure include processes and components, such as sacrificial layer removal, support structure fabrication, and handle attachment for layer preservation, that are compatible with these and other next-generation quantum device demands.

Figures 1A, 1B, 1C:
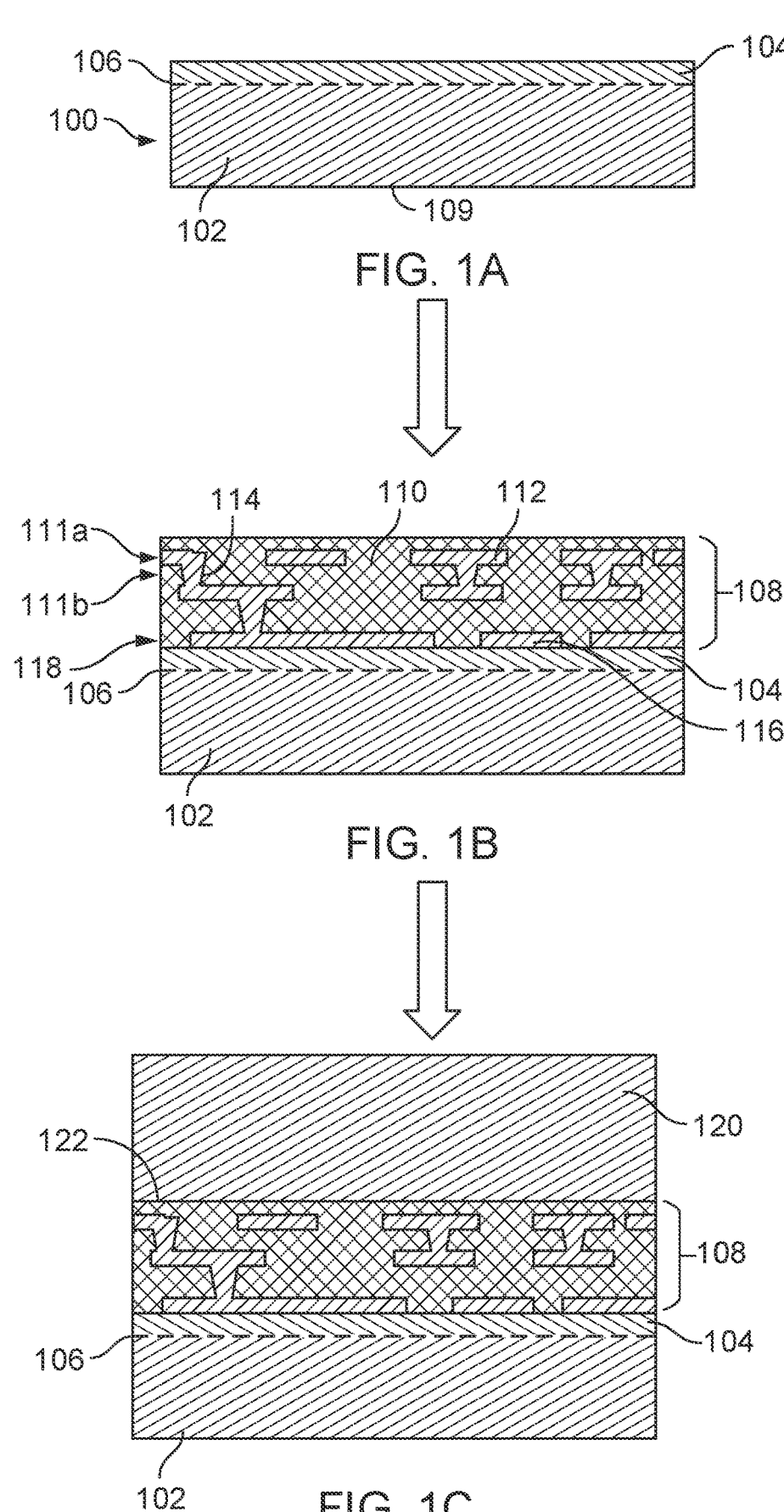
FIGS. 1A-1F are schematics illustrating an example of a chip fabrication process.

FIGS. 1A-1E illustrate an example of a process for fabricating a chip. As shown in FIG. 1A, a structure 100 (illustrated in a cross-sectional view) includes a first substrate 102, a first layer 104 on the first substrate 102, and an intermediate layer 106 between the first substrate 102 and the first layer 104. Some implementations according to this disclosure do not include the intermediate layer 106, e.g., the first layer 104 can be disposed directly on a surface of the first substrate 102 and/or the intermediate layer 106 can be interpreted as a portion of the first substrate 102.

In some implementations, the structure 100 is an SOI (silicon-on-insulator) structure in which the first substrate 102 is a silicon substrate, the first layer 104 is a silicon layer (e.g., a single-crystal (monocrystalline) silicon layer), and the intermediate layer 106 is an insulator, such as silicon oxide (e.g., silicon dioxide). SOI structures can be useful because of their widespread availability, their reduced substrate-originating parasitic capacitance, and the improved control and flexibility of fabrication provided.

In some implementations, the first layer 104 is a layer satisfying one or more coherence requirements for use with quantum devices (e.g., qubits, qubit control elements, and/or qubit readout elements) disposed on or near the first layer 104. The first layer 104 also can be referred to as a coherent substrate layer, because the layer acts as a substrate on which coherent devices can be formed. For example, a single-crystal silicon layer as the first layer 104 can be a coherent substrate layer. The silicon layer can be intrinsic silicon with a high resistivity, e.g., a resistivity greater than 10,000 Ohm-cm. In some implementations, the silicon layer has a thickness between 1 μm and 30 μm, such as between 5 μm and 20 μm, thicknesses which, in some implementations, can be suitable for subsequent processing (e.g., forming device 142).

In some implementations, the coherence requirement(s) of the first layer 104 include a microwave loss tangent requirement. Materials with higher microwave loss tangents (dielectric loss tangents for microwave frequencies) are more likely to absorb energy from qubits or qubit coupling devices in proximity to the materials, harming the coherence of the qubits or qubit coupling devices. For example, when device 142 (described in more detail below) on the first layer 104 is a qubit control element or a qubit readout element, energy/signals from the device 142 may be absorbed by the first layer 104, causing heating of the device 142 and/or reducing a coherence of coupling between the device 142 and a qubit. The degree of absorption can be based at least on the microwave loss tangent of the first layer 104. Accordingly, in some implementations, the microwave loss tangent of the first layer 104 is relatively low in order to decrease microwave absorption by the first layer 104. For example, in some implementations, the first layer 104 has a microwave loss tangent less than $10^{-5}$, less than $10^{-4}$, or less than $10^{-3}$. In some implementations, the microwave loss tangent is at least $10^{-6}$. For example, single-crystal silicon in an SOI structure can have a microwave loss tangent in one or more of these ranges. In some implementations, the first layer 104 is a layer of another material (e.g., another monocrystalline semiconductor material) that has a loss tangent in one or more of these ranges.

The first layer 104 may also offer advantages in addition to high coherence properties. For example, the first layer 104 may include a material exhibiting high charge-carrier mobility that can be used to support a semiconductor logic device, a photovoltaic device, or a sensing device. The high-charge mobility material may be formed at high temperatures that would be incompatible with metal components in the same sample.

Other combinations of materials to form the structure 100 are also within the scope of this disclosure. For example, in some implementations, the first substrate 102 is a semiconductor or an insulator. Particular examples of substrate materials include silicon, germanium, sapphire, and glass. In some implementations, the intermediate layer 106 is a dielectric layer, such as an oxide layer (e.g., a semiconductor oxide such as silicon oxide or a metal oxide such as aluminum oxide or hafnium oxide), a nitride layer (e.g., silicon nitride), an oxynitride layer (e.g., silicon oxynitride), or another type of layer. In some implementations, the intermediate layer 106 is thermally grown, e.g., a thermally-grown buried silicon oxide on a silicon first substrate 102. In some implementations, the intermediate layer 106 is a chemically-deposited layer, such as a chemical vapor-deposited (CVD) layer or a layer deposited by atomic layer deposition (ALD).

The first substrate 102 can be referred to as a handle in that the first substrate 102 can be handled directly during fabrication processing. For example, a bottom surface 109 of the first substrate 102 can be placed on platens of fabrication tools, the bottom surface 109 can be held by a vacuum chuck, and/or the bottom surface 109 can be in contact with a transfer tool for transferring the structure 100 and succeeding structures between fabrication tools. Handling the first substrate 102 (e.g., instead of directly handling the first layer 104) can allow the first layer 104 to retain its desired properties, such as high coherence, by avoiding contamination or damage. When the first substrate 102 is or includes a wafer (e.g., a silicon wafer), the first substrate 102 can be referred to as a handle wafer.

As shown in FIG. 1B, a circuit element layer stack 108 is formed on the first layer 104. The circuit element layer stack 108 includes multiple circuit element layers (such as adjacent layers 111a, 111b), and the layers 111 include multiple circuit elements (such as circuit elements 112 and 114). For example, the circuit elements can include transmission lines 112 that extend laterally through a layer; via contacts 114 that extend vertically through two or more layers through a via formed in the two or more layers; and/or a ground plane (e.g., formed of a superconductor material, such as a superconductor metal) that can electromagnetically shield other elements. The transmission lines 112 and via contacts 114 can be collectively referred to as wiring. Other examples of circuit elements include passive and/or active elements, e.g., resistors, capacitors, inductors, and/or diodes, among others. The circuit elements can include classical and/or quantum devices, e.g., transistors, qubits, qubit control elements, qubit readout elements, and/or Josephson logic elements, among others. In some implementations, the circuit elements include one or more circuit elements 116 arranged in a circuit element layer 118 adjacent to the first layer 104, e.g., in contact with the first layer 104. The wiring can be configured to carry signals. For example, wiring including transmission lines 112 and/or via contacts 114 can receive a signal at one end and transfer the signal to another end. The first layer 104 can act as the dielectric layer of a parallel-plate capacitance element between metal formed on either side, e.g., at least one of the one or more circuit element 116 in circuit element layer 118 and at least one circuit element arranged on the first layer 104 (e.g., device 142 in some implementations).

In some implementations, at least some of the circuit elements are formed of an electrically conductive material and/or a superconductor material. An electrically conductive material is a material that conducts electricity efficiently at room temperature, such as a metal or a doped semiconductor. For example, palladium, gold, silver, and platinum are conductive metals. A superconductor material is a material that, when cooled below a critical temperature, exhibits superconductivity. Examples of superconductor materials include superconductor metals such as niobium, aluminum, tantalum, molybdenum, tin, indium, and titanium; ceramics such as YBCO superconductors; and alloys or compounds thereof, e.g., niobium-titanium and titanium nitride. In some implementations, the circuit elements include a stack of materials, e.g., Al/Nb. In some implementations, the circuit elements include superconductor transmission lines and/or superconductor via contacts for transferring signals. For example, the signals can include microwave signals having a frequency between about 1 GHz and about 10 GHz. In some implementations, the signals can include signals of one or more other frequency ranges, e.g., signals having a frequency between 0 Hz (DC signals) and 1 GHz. The signals can be used, for example, as qubit readout signals and/or qubit control signals.

In some implementations, the circuit element layer stack 108 includes a filler material 110, also referred to as a sacrificial material, between the circuit elements in the circuit element layer stack 108. For example, the filler material 110 can be a dielectric material. In some implementations, the filler material 110 is an oxide, a nitride, or an oxynitride, e.g., one or more of the materials described for the intermediate layer 106. In some implementations, the filler material 110 is an organic material, e.g., a polymer. In some implementations, the filler material 110 is a metal, e.g., copper.

The circuit element layer stack 108 can be formed by a combination of fabrication methods including, for example: material deposition such as spin-on deposition, physical layer deposition (e.g., thermal evaporation, electron-beam evaporation, and/or sputtering), and/or chemical deposition (e.g., CVD and/or ALD); material patterning (e.g., by photolithography, electron-beam lithography, and/or imprint lithography); and/or material removal (e.g., wet-chemical etching and/or plasma etching). Suitable combinations of selective processes can be used to form the circuit elements with desired dimensions and parameters.

As shown in FIG. 1C, a second substrate 120 is attached to a surface 122 of the circuit element layer stack 108, e.g., the surface 122 opposite the first layer 104. The second substrate 120 can be any substrate suitable for subsequent handling. For example, in some implementations the second substrate 120 is a silicon substrate, a glass substrate, or another substrate type described in reference to the first substrate 102. In some implementations, the second substrate 120 and the first substrate 102 are formed of the same material. For example, both the first substrate 102 and the second substrate 120 can be a silicon substrate. In some implementations, the second substrate 120 is at least 200 μm thick, at least 400 μm thick, or at least 600 μm thick. In some implementations, the second substrate 120 has a thickness less than 2 mm or less than 1 mm. In some cases, these thicknesses are sufficient for the resulting structure to be handled using the second substrate 120. Accordingly, the second substrate 120 can be referred to as a handle. When the second substrate 120 is or includes a wafer (e.g., a silicon wafer), the second substrate 120 can be referred to as a handle wafer.

In some implementations, the second substrate 120 includes embedded circuitry for routing signals (e.g., control signals) to and/or from circuit element layer stack 108. The embedded circuitry can include, for example, wiring (e.g., via contacts and/or transmission lines), logic elements (e.g., classical and/or quantum logic elements, such as transistors, qubits, and/or Josephson logic elements). The embedded circuitry can include any one or more of the circuit elements described above for circuit elements of the circuit element layer stack 108. In some implementations, the second substrate 120 includes one or more high thermal-conductivity materials (e.g., metals) arranged to provide an efficient thermalization path for the circuit element layer stack 108.

In some implementations, prior to attachment of the second substrate 120, the surface 122 is planarized and/or polished to provide a flat, smooth surface for subsequent attachment of the second substrate 120. For example, a chemical mechanical polishing (CMP) process can be performed, including, for example, application of a chemical slurry in combination with a mechanical polishing pad.

In different implementations, various methods can be used to attach the second substrate 120 to the surface 122 of the circuit element layer stack 108. The second substrate 120 can be bonded to the surface 122. For example, the second substrate 120 can be a silicon substrate, and the surface 122 can be a silicon dioxide surface, e.g., a surface of the filler material 110, where the filler material 110 is silicon oxide. An Si—SiO$_2$ bond can be formed by a fusion bond/direct bond method. In some implementations, an annealing step is included, e.g., an anneal to a temperature above 500° C. during bonding, to improve a strength of the bond between the silicon and the silicon oxide. In some implementations, the anneal is to an elevated temperature that is less than a temperature at which the first layer 104 is formed.

In some implementations, the surface 122 and a corresponding surface of the second substrate 120 are metal surfaces, and a metal-to-metal bond is formed to attach the second substrate 120 to the surface 122. For example, a first metal layer can be formed on the circuit element layer stack 108, and a surface of the first metal layer is the surface 122. A second metal layer (of the same metal(s) as the first metal layer, or different metal(s)) can be formed on the second substrate 120 (e.g., included on the second substrate 120 as a portion of the second substrate 120). These layers can be formed by physical layer deposition, by direct application of the metal to wet the surface (e.g., in an indium bonding process), or any other suitable method. A thermal compression bond can then be formed between the two metal layers, e.g., by applying heat and pressure. The metal layers can include indium, tin, copper, aluminum, gold, silver, alloys thereof, and/or any other suitable metal. The first metal layer and the second metal layer can be continuous films and/or patterned films, e.g., films covering only some portions of the surface 122 and the corresponding surface of the second substrate 120.

Other bond types are also within the scope of this disclosure. In some implementations, the surface 122 or the second substrate 120 includes a metal, and the other of the surface 122 or the second substrate 120 includes a semiconductor. For example, the metal can be aluminum, the semiconductor can be germanium, and the resulting bond can be an Al—Ge bond. In some implementations, the surface 122 and the second substrate 120 are joined by an adhesive, e.g., a silicone adhesive.

The arrangement of layers of the structure illustrated in FIG. 1B provides a great deal of flexibility for attaching the second substrate 120 to the surface 122. This is at least because the first layer 104, the coherence/loss-related properties of which may be important to device performance, is (i) separated from the bond by the circuit element layer stack 108 and (ii) protected, on the first layer's 104 opposite side, by the first substrate 102. Process limitations that may apply to the first layer 104 may be of less relevance to the attachment interface between the second substrate 120 and the surface 122. For example, while the first layer 104 may have strict coherence requirements and/or electrical requirements that limit processing of the interfaces of the first layer 104 and/or the first layer 104 itself, any requirements (if present) for the portions of the circuit element layer stack 108 and the second substrate 120 near the interface between the surface 122 and the second substrate 120, and/or the interface itself, may be more relaxed. Accordingly, materials and processes associated with the bonding can be selected to provide high bonding strength and durability (such as metals for a metal-metal bond) without damaging the first layer 104, e.g., without compromising the coherence, loss characteristics, crystallinity, or high-diffusivity of the first layer 104.

In addition, in some implementations, at the time of bonding, device(s) 142, discussed in more detail below in reference to FIG. 1E, have not yet been formed on the first layer 104. Devices 142 may themselves have characteristics that must be carefully maintained, e.g., high coherence for devices that couple to qubits. These physical parameters may be unfavorably adjusted by the bonding process (e.g., by elevated temperatures, such as temperatures above 500° C.); however, because, in some implementations, the devices 142 are not present when the second substrate 120 is attached, the attachment process can be performed without significantly compromising chip performance.

Figures 1D, 1E:
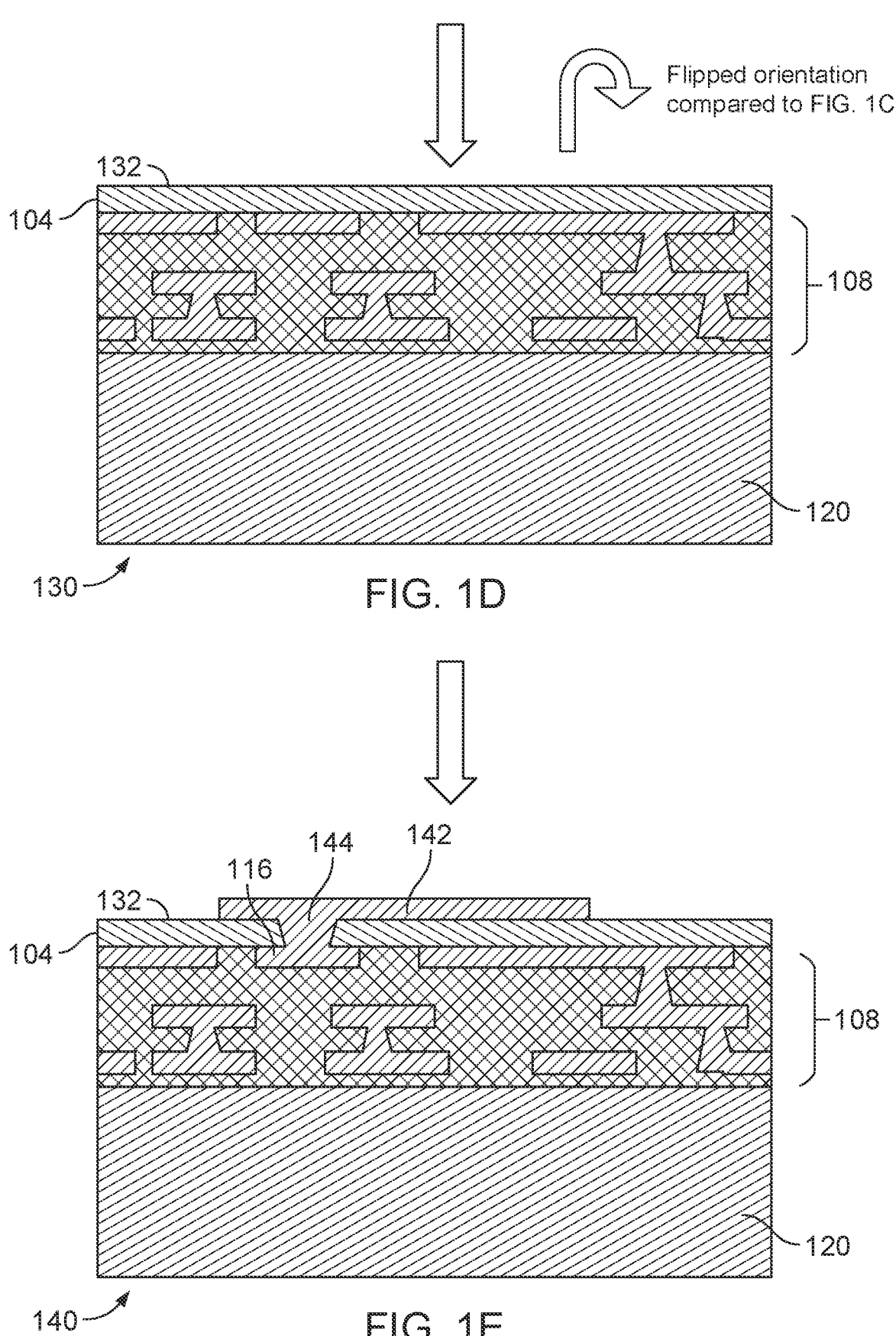

As shown in FIG. 1D, the first substrate 102 is removed (along with, in some implementations, the intermediate layer 106) to form a structure 130 that includes the second substrate 120, the circuit element layer stack 108 (including circuit elements in the circuit element layer stack 108, e.g., embedded in the filler material 110), and the first layer 104 on the circuit element layer stack 108. The cross-sectional view of FIG. 1D is flipped compared to the views of FIGS. 1A-1C—for example, the second substrate 120, illustrated on the top in FIG. 1C, is illustrated on the bottom in FIGS. 1D-1F. A surface 132 of the first layer 104, previously covered under the first substrate 102, is exposed. One or more suitable methods can be used to remove the first substrate 102. In some implementations, the first substrate 102 is removed with one or more etches. For example, the first substrate 102 can be removed in a dry etch, e.g., an SF$_6$ plasma etch. In some implementations, the first substrate 102 is removed in a wet chemical etch, such as a KOH etch or a tetramethylammonium hydroxide (TMAH) etch; a sealed fixture can be used to protect the remainder of the structure from the etchant. In some implementations, the first substrate 102 is first mechanically ground to remove most of the first substrate 102, leaving only a thin portion of the first substrate 102 (e.g., less than 50 μm, such as between 10 μm and 40 μm) attached to the first layer 104, and the remainder of the first substrate 102 is removed in a wet chemical etch and/or dry etch process. In some implementations, the intermediate layer 106 is a silicon oxide layer, and the intermediate layer 106 is removed in an HF etch process, such as an HF wet chemical etch or a vaporous HF etch. The one or more etch processes can be selected to render the surface 132 clean for subsequent device formation and to not compromise any material requirements (e.g., coherence and/or electrical requirements) of the first layer 104.

With the first substrate 102 removed, the second substrate 120 is available for handling of the structure 130. For example, during etch process(es) performed to remove the first substrate 102, the structure 130 can be handled using the second substrate. For example, when a plasma etch process is used to remove the first substrate 102, the second substrate 120 can be face-down on a chuck of the etch tool. Moreover, the second substrate 120 can be handled to transfer the structure 130 between fabrication tools and during fabrication steps. For example, the structure 130 can be transferred by being placed on a transfer chuck, transfer arm, or other transfer tool with the second substrate 120 in contact with the transfer tool, and the transfer tool can transfer the structure 130 between fabrication tools and/or within a fabrication tool by maintaining contact with the second substrate 120. As another example, a vacuum chuck can hold the second substrate 120 by suction, e.g., to spin the structure 130 to apply photoresist on the surface 132 in a subsequent fabrication process. In the absence of the second substrate 120, the remaining portions of the structure 130 (e.g., the circuit element layer stack 108 and the first layer 104) may be too thin to be reliably handled without a high risk of damage.

As shown in FIG. 1E, a device 142 is formed on the first layer 104 (e.g., directly on the surface 132 or with one or more intervening layers). In addition, in some implementations, a via contact 144 is formed through the first layer 104 to electrically (galvanically) connect the device 142 to a circuit element 116 included in the circuit element layer stack 108 under the first layer 104. In some implementations, the device 142 can couple electromagnetically to the circuit element 116 without the galvanically-connecting via contact 144, e.g., by exchange of electromagnetic signals through the first layer 104. A resulting first chip 140 includes the second substrate 120, the circuit element layer stack 108, the first layer 104, and the device 142. One or more suitable fabrication processes can be performed to form the device 142 and the via contact 144. In some implementations, a mask layer (e.g., a photoresist layer or a hard mask layer) is formed on the first layer 104 and patterned to define an aperture. An etching process can then be formed through the aperture to define a hole in the first layer 104 for the via contact 144. One or more subsequent deposition processes, in some cases with further patterning/lithography, can be performed to deposit the via contact 144 through the hole and the device 142 on the first layer 104. Although a single device 142 is illustrated, many devices (of the same type and/or different types) can be formed on the first layer 104.

The device 142, which can include a single material or multiple materials, can have one or more electrical, electronic, optical, coupling, and/or other functions. For example, the device 142 can be a classical logic device, such as a transistor. In some implementations, the device 142 is a sensor, such as a photosensor (e.g., a photodiode) or a chemical sensor. In some implementations, the device 142 is a quantum logic device, e.g., a qubit such as a superconducting qubit, e.g., a charge qubit, a flux qubit, or a phase qubit.

In some implementations, the device 142 is a qubit control or readout element. A qubit control element or qubit readout element is configured (e.g., by shape, dimensions, and/or material) to couple to a qubit. Non-limiting examples of qubit control elements include a qubit Z-control element for tuning a frequency of a qubit and a qubit XY-control element for exciting a qubit. For example, a qubit control element can couple electromagnetically (e.g., inductively and/or capacitively) to a qubit and provide a signal (e.g., a microwave signal) to the qubit to tune the qubit frequency or excite the qubit. The qubit control element can include a portion of superconductor material (e.g., a pad or a transmission line) arranged to be in proximity to a qubit so as to couple to the qubit (e.g., by an electromagnetic coupling, such as a capacitive and/or inductive coupling). A non-limiting example of a qubit readout element includes a qubit readout resonator having a resonance frequency that is shifted based on the state of a qubit coupled to the qubit readout resonator. When a pulse near the resonator frequency is applied to the qubit readout resonator, the shift can be identified, and the qubit state can be determined. For example, when the device 142 is a qubit readout resonator, a pulse can be applied to the qubit readout resonator through transmission lines and via contacts in the circuit element layer stack 108 (e.g., superconducting transmission lines and via contacts) and through the via contact 144. A resulting reflected signal indicative of the qubit state can travel from the device 142, through the via contact 144, and through the transmission lines and via contacts in the circuit element layer stack 108, to be received at a detection device. A qubit readout resonator can include a film of superconductor material (e.g., any of the superconductor materials described herein) patterned in a meandering shape to form a meander resonator that capacitively and/or inductively couples to a nearby qubit. The meander resonator can be coupled to a pad of superconductor material arranged to be in proximity to a qubit so as to couple to the qubit (e.g., by an electromagnetic coupling, such as a capacitive and/or inductive coupling). Device 142 can include other circuit elements to be used as part of a quantum computing system, as well. For instance, device 142 can include an amplifier device, such as a Josephson amplifier. As further examples, the device 142 can include a Purcell filter, a resonator, a wire bond pad, a ribbon bond pad, or a bump connection.

Devices that are qubits or that are designed to couple to qubits can be referred to as "coherent" devices, because the qubits' performance depends on coherent quantum coupling and state retention. Coherent operation of these devices may be provided at least in part by the properties of the underlying first layer 104. Because the first layer 104 is formed before the fabrication of the circuit element layer stack 108, the first layer 104 can be formed to have particular desired characteristics that provide the coherence. For example, as described above, the first layer 104 can be a monocrystalline Si layer where the monocrystallinity is provided by a high-temperature process that may be incompatible with the presence of the circuit element layer stack 108, e.g., incompatible with metal circuit elements in the circuit element layer stack 108. Accordingly, the first layer 104 can have coherence properties, such as a microwave loss tangent in a range defined above, that is compatible with coherent operation of the device 142 (such as a readout resonator), e.g., operation of the device 142 with an internal quality factor $Q$ of at least 105, e.g., between $5 \cdot 10^5$ and $5 \cdot 10^6$. Formation of the first layer 104 with the desired coherence-related properties may be incompatible, instead or additionally, with the presence of the device 142 during formation of the first layer 104. For example, the device 142 can be formed of a superconductor metal that is incompatible with the high temperatures used to form a single-crystal Si layer. For example, at temperatures used for forming the first layer 104 (e.g., temperatures of at least 800° C., at least 900° ° C., or at least 1000° C., in some implementations), the metal may diffuse into the first layer 104, adjusting the first layer's properties (e.g., increasing the microwave loss tangent of the first layer 104). The temperatures may instead or additionally cause deformation, melting, oxidation, and/or other modifications of metal devices themselves, e.g., the device 142. As another example, if the first layer 104 is formed on the filler material 110, the temperatures used to form the first layer 104 may cause modifications of the filler material 110, e.g., reduction of the filler material 110, in some cases adversely affecting operation of the device 142 and/or the circuit elements of the circuit element layer stack 108.

In addition, in some implementations, because at least one surface of the first layer 104 is buried under the first substrate 102 and the intermediate layer 106 during much of the fabrication process (e.g., during attachment of the second substrate 120 and/or during fabrication of the circuit element layer stack 108), the first layer 104 is protected during the fabrication process, retaining its desired properties. Accordingly, the first layer 104 can be formed before the circuit element layer stack 108 and before the device 142, so that each component of the first chip 140 can have respective desired properties that result in high-coherence operation of the first chip 140 to couple to qubits.

Figure 1F:
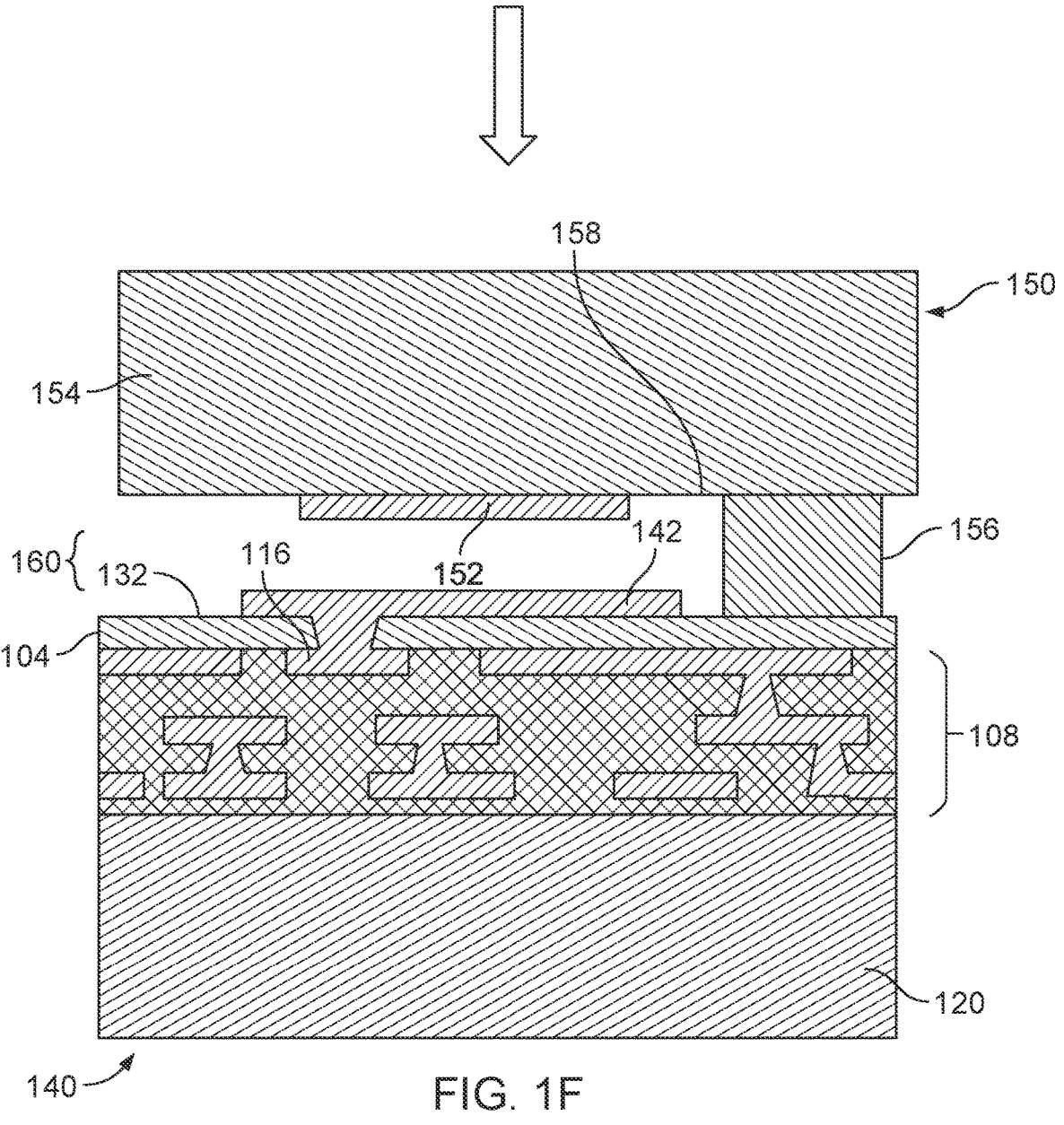

In some implementations, the first chip 140 is a stand-alone device usable to perform one or more tasks, e.g., sensing or control operations. In some implementations, as shown in FIG. 1F, a second chip 150 is bonded to the first chip 140, e.g., in a flip-chip configuration. In some implementations, the second chip 150 includes a third substrate 154 and a second device 152 arranged to interact with the device 142 on the first chip 140. The first chip 140 and the second chip 150 can be bonded, for example, by a bump bond 156 including a bonding material, such as indium, a solder, or another bonding material. In some implementations, a thermal reflow process is used to form the attachment. The bump bond 156 can provide a purely mechanical bond or can also provide an electrical connection between a component of the first chip 140 and a component of the second chip 150. To form the bond, material of the bump bond 156 can be deposited on the first chip 140 or the second chip 150, and pressure and/or heat can be applied with the bump bond 156 in contact with the first chip 140 and the second chip 150, to form a mechanically resilient attachment. In some implementations, the bump bond 156 is disposed directly on the first layer 104. The third substrate 154 can be a semiconductor substrate, a dielectric substrate, or a combination thereof (e.g., having multiple layers), such as any of the substrate types described herein.

The second chip 150 can be a single chip (e.g., a single semiconductor substrate or printed circuit board having integrated devices) or a stack of integrated chips. Circuit elements can be disposed on one or both sides of the second chip 150, and/or embedded within the second chip 150.

In some implementations, the second device 152 is disposed on a surface 158 of the second chip 150 that faces the first chip 140. Accordingly, the second device 152 and the device 142 can interact with one another through a gap 160 between the first chip 140 and the second chip 150 (e.g., between the second device 152 and the device 142). The gap 160 can be a region free of solid material, e.g., having a vacuum (e.g., a vacuum in a range described above). In some implementations, the gap 160 can filled with a gas, such as the ambient atmosphere or an inert gas, such as nitrogen and/or argon. In some implementations, the gas is present in the gap 160 at atmospheric pressure or at a lower pressure, such as a pressure less than $10^{-3}$ Torr or a pressure less than $10^{-6}$ Torr.

In some implementations, the second device 152 is a qubit, such as a charge qubit (e.g., a transmon), a phase qubit, or a flux qubit. The qubit can couple electromagnetically, over the gap 160, to the device 142, which, as described above, can be a qubit control element or a qubit readout element. In such implementations, the first chip 140 can be referred to as a qubit control chip, and the second chip 150 can be referred to as a qubit chip. Accordingly, qubit control operations or qubit readout operations can be performed through a coupling between the device 142 and the second device 152. To facilitate the coupling, in some implementations, the second device 152 can be arranged to overlap the device 142 of the first chip 140, e.g., to be at least partially directly above the device 142. In some implementations, the second device 152 is arranged in proximity to the device 142 without overlapping the device 142.

The characteristics of the first layer 104 can be such that the first layer 104 does not interfere with the qubit operations, e.g., allows coherent coupling between the device 142 and the second device 152. For example, the first layer 104 can be a layer, such as single-crystal silicon, that has a microwave loss tangent in a range defined above, to reduce or substantially eliminate absorption of energy from the device 142 and the second device 152 by the first layer 104. At least because of the fabrication methods described herein, the first layer 104 retains the desired properties and allows for low-loss, coherent coupling. In some implementations, an array of qubits is disposed on the second chip 150, and each qubit of at least some of the qubits in the array is arranged to couple to (i) a corresponding qubit readout element on the first chip 140, and/or (ii) one or more corresponding qubit control elements on the first chip 140, the qubit readout elements and the qubit control elements being examples of devices 142 on the first layer 104. Qubits and/or other devices can be formed on and/or in the second chip 150 by suitable fabrication techniques, e.g., material deposition and patterning (e.g., by photolithography and/or electron-beam lithography).

The first chip 140 and the second chip 150 can together form a quantum processor usable to perform quantum computations. Control signals for the qubits can be provided to qubit control elements through circuit elements in the circuit element layer stack 108, e.g., from a separate chip electrically coupled to the circuit elements of the circuit element layer stack 108. For example, the separate chip (which can be configured to operate at room temperature or at superconducting temperatures) can be electrically coupled to the circuit elements by wire bonds. Correspondingly, readout signals indicative of states of the qubits can be obtained at the separate chip, from qubit readout elements, through the circuit elements of the circuit element layer stack 108. Further details on an example of a two-chip arrangement for qubit control and readout can be found in U.S. Application Publication No. 2020/0012961, the entirety of which is incorporated herein by reference.

Other implementations of the second chip are within the scope of this disclosure. For example, in some implementations, the second chip does not include a surface device arranged to couple to the device 142 over the gap 160. In some implementations, a material wholly or partially fills the gap 160. In some implementations, instead of or in addition to the coupling between the device 142 and the second device 152, the second chip includes one or more buried devices that couple to the device 142 or a circuit element of the first chip 140 through a physically-connected conduction path. For example, the device 142 and/or a circuit element in the circuit element layer stack 108 can be electrically coupled to one or more buried devices of the second chip so as to receive and/or transmit signals therebetween.

In the example of the fabrication process illustrated in FIGS. 1A-1F, the via contact 144 through the first layer 104 that electrically couples the device 142 to the circuit element 116 is formed after removal of the first substrate 102, e.g., during a portion of the fabrication process that also forms the device 142. In some implementations, the via contact 144 is formed at a different step in the fabrication process. For example, as shown in FIG. 2A, in some implementations, the via contact 144 is formed before and/or during construction of the circuit element layer stack 108, e.g., while the first substrate 102 remains attached to the first layer 104 and/or prior to attachment of the second substrate 120. For example, starting with the structure 100 illustrated in FIG. 1A, a lithography process can be performed to etch an aperture in the first layer 104, and material of the via contact 144 can be deposited in the aperture to form the via contact 144. The via contact 144 can be formed to extend through the first layer 104 and contact the intermediate layer 106 or the first substrate 102.

Because, in some implementations, the via contact 144 (along with, in some cases, the device 142) is formed of the same material as the circuit elements of the circuit element layer stack 108 (e.g., a superconductor metal), it can be convenient to perform the fabrication of the circuit element layer stack and the via contact 144 together. Moreover, when the via contact 144 is formed while the first substrate 102 remains in the structure 100, processing of the first layer 104 is performed from a side 202 of the first layer 104 that is opposite the surface 132 on which the device 142 will be formed. In some cases, the properties of the surface 132 will be more important for subsequent operation of the device 142 than properties of the side 202, e.g., because the surface 132 is closer to the device 142. Accordingly, in some cases, any damage to or undesired modification of the first layer 104 associated with formation of the via contact 144 may have fewer or no negative repercussions for operation of the device 142, when the via contact 144 is formed as shown in FIG. 2A instead of as shown in FIG. 1E.

FIG. 2B illustrates a structure 204 (shown with a flipped orientation compared to FIG. 2A) that can be formed based on the structure 200 illustrated in FIG. 2A. The second substrate 120 is attached and the first substrate 102 is removed, as described in reference to FIGS. 1D-1E. When the first substrate 102 is removed, the via contact 144 is exposed in the structure 204. The device 142 can then be formed on the first layer 104, electrically coupled to the via contact 144, to obtain the first chip 140 illustrated in FIG. 1E.

In some implementations, the filler material 110 of the circuit element layer stack 108 can be wholly or partially removed. The filler material 110 may be associated with signal interference and/or loss, e.g., by interacting with signals carried by the circuit elements in the circuit element layer stack 108. For example, in the context of the circuit element layer stack 108 being included in a qubit control/readout chip, the circuit elements of the circuit element layer stack 108 can include superconducting circuit elements, such as transmission lines and via contacts formed of a superconductor material, that carry microwave signals to/from qubit control and readout devices. As qubit density increases with further development, so too does a density of the qubit control and readout devices, and, correspondingly, a density and/or number of the transmission lines and via contacts also increases. For example, the circuit element layer stack 108 may include an increased number of layers to include an increased number of circuit elements, and/or the circuit elements in the circuit element layer stack 108 may be more densely packed. The filler material 110 can be a dielectric, such as an oxide or a nitride. However, the microwave energy carried by the circuit elements can be partially absorbed by the filler material 110, resulting in heating and loss of the microwave energy. Because qubit control/readout chips are held at superconducting temperatures during operation, this excess heat can complicate chip design by necessitating additional heat dissipation structures, and/or can impair chip operation if the heat is not fully dissipated. For example, the heating can cause loss of quantum coherence in the device 142 and qubit(s). Moreover, if microwave energy is lost in the filler material 110, a higher input level of microwave energy may be required to compensate for the loss. In addition, the filler material 110 can introduce parasitic loss mechanisms (e.g., parasitic two-level systems) to which quantum devices, such as qubits and qubit coupling devices, can couple, leading to decoherence of quantum devices/signals.

However, if the filler material 110 is wholly or partially removed, microwave energy absorption and/or quantum decoherence can be reduced. In this context, the filler material can be referred to as a "sacrificial material," because the filler material is used for fabrication and then removed.

Figures 3A, 3B:
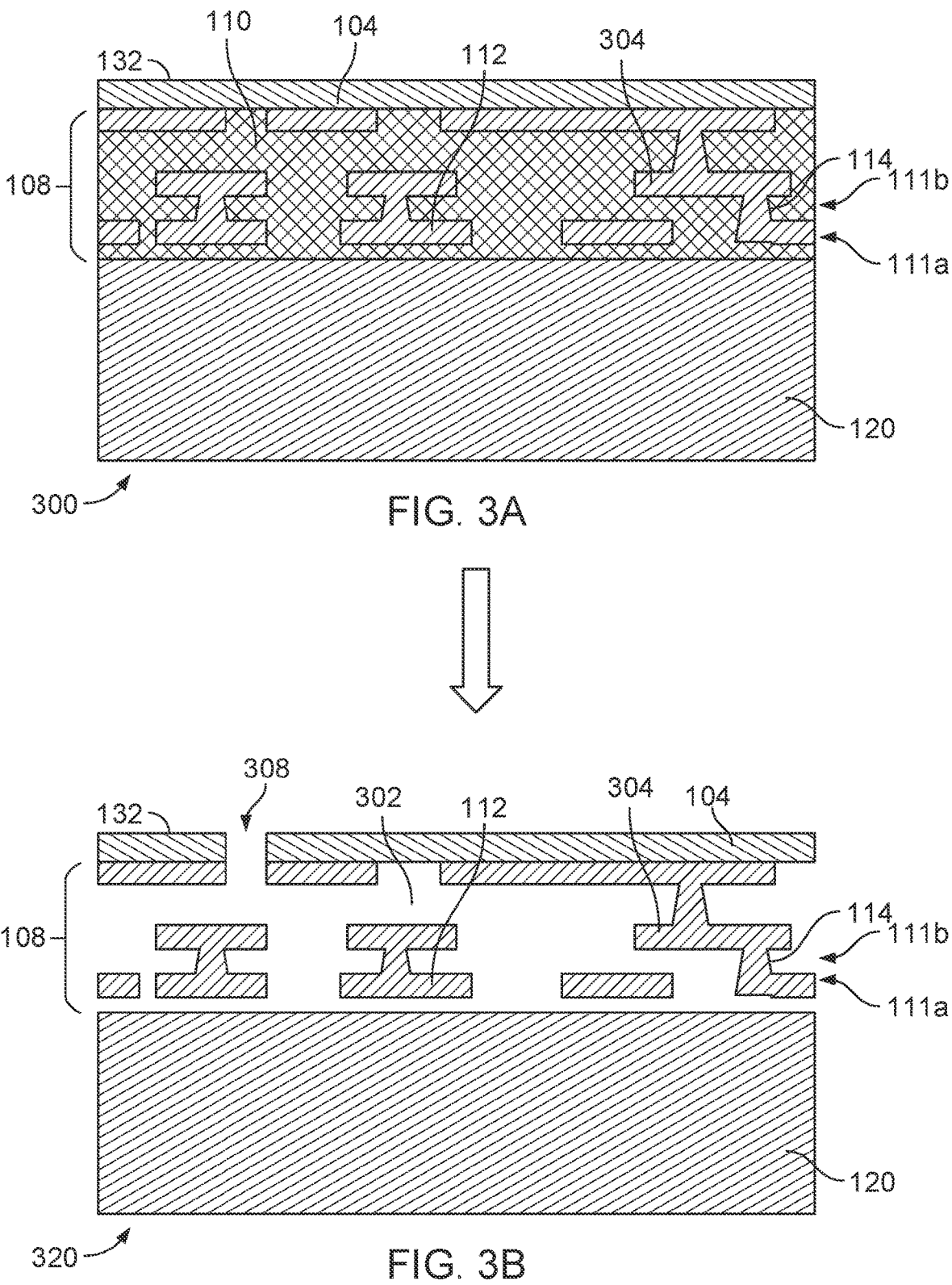
FIGS. 3A-3B are schematics illustrating an example of a chip fabrication process.

As shown in FIG. 3A, a structure 300 (also illustrated in FIG. 1D) includes the second substrate 120, the circuit element layer stack 108, and the first layer 104. The circuit element layer stack 108 includes circuit elements 304 distributed throughout the plurality of circuit element layers of the stack. For example, transmission line 112 extends laterally in layer 111a, and via contact 114, in layer 111b, electrically couples circuit elements in the two layers adjacent to layer 111b. The filler material 110 fills spaces between the circuit elements 304. For example, the filler material 110 can be formed layer-by-layer during fabrication of the circuit element layer stack 108 (e.g., as described in reference to FIG. 1B), assisting in fabrication of the circuit elements 304.

Elements of the structure 300 can have characteristics as described in reference to corresponding elements of FIGS. 1A-1F, e.g., as described in reference to structure 130. However, the structure 300 need not be formed by the same or a similar process as the structure 130. For example, the circuit element layer stack 108 of FIG. 3A can be formed on the second substrate 120, e.g., without use of the first substrate 102. The first layer 104 need not be included in the structure 300.

As shown in FIG. 3B, the filler material 110 can be wholly or partially removed from the structure 300 to obtain the multi-layer chip structure 320. Instead of the filler material 110 between the circuit elements 304, a space 302 exists. For example, during operation of a chip including the multi-layer chip structure 320 or a structure derived therefrom, the chip can be in a vacuum, such that the space 302 is a vacuum between the circuit elements 304. For example, the vacuum can be a vacuum less than $10^{-6}$ Torr, less than $10^{-7}$ Torr, less than $10^{-8}$ Torr, or less than $10^{-9}$ Torr. The multi-layer chip structure 320 can be further processed, e.g., as described in reference to FIGS. 1E-1F, such as to form a two-chip structure where the multi-layer chip structure 320 (or a modified version thereof, e.g., with a device formed on the first layer 104) forms part of one of the chips. Removal of the filler material 110 can be performed at various points in the fabrication process, in different implementations. In some implementations, removal of the filler material 110 is performed on a structure, such as structure 300 or structure 400, that includes the circuit element layer stack 108, prior to the structure being attached to a second chip (e.g., chip 150) in a flip-chip configuration. The structure on which filler material removal is performed can, but need not, include a device (e.g., device 142) formed on a layer (e.g., first layer 104) of the structure.

In some implementations, the filler material 110 is removed by one or more etching processes. For example, an isotropic etchant, such as a wet chemical etchant or a vaporous etchant, can enter the circuit element layer stack 108 (e.g., laterally and/or through one or more vent holes) and spread throughout the circuit element layer stack 108. In some implementations, a single etch process, such as a single period of placement in a wet etchant or a single period of placement in a vaporous etchant, is performed to remove the filler material 110. In some implementations, multiple layers of the filler material 110 (e.g., all layers of the filler material 110) are removed. For example, the filler material 110 can be removed from both layers 111a and 111b. In some implementations, the filler material 110 is removed from all circuit element layers of the circuit element layer stack 108 between the first layer 104 and the second substrate 120.

In some implementations, one or more vent holes are formed to promote diffusion of the etchant through the circuit element layer stack 108. For example, as shown in FIG. 3B, one or more vent holes 308 can be formed through the first layer 104, so that the etchant can pass through the vent holes 308 and etch the filler material 110. In some implementations, the vent holes 308 are arranged such that filler material 110 is removed from only some areas of the structure 300. For example, a first area of the structure 300 with many circuit elements 304 can be provided with vent holes 308 and the filler material 110 can be removed from the first area, to reduce loss in that area from signal transmission through the circuit elements 304. A second area of the structure 300 with few or no circuit elements 304 may exhibit little or no loss even if the filler material 110 remains in place; accordingly, in some implementations, the filler material 110 may not be removed from the second area.

Etchant(s) used to remove the filler material 110 can include any etchant that selectively etches the filler material 110 compared to the material(s) of the circuit elements 304. In some implementations, the filler material 110 is silicon dioxide, and the etchant(s) include an HF solution and/or vaporous HF. To facilitate removal, the filler material 110 can be selected so that the filler material 110 can be selectively etched compared to the circuit elements 304, e.g., by a commonly-available wet or vaporous etchants.

Figure 4A:
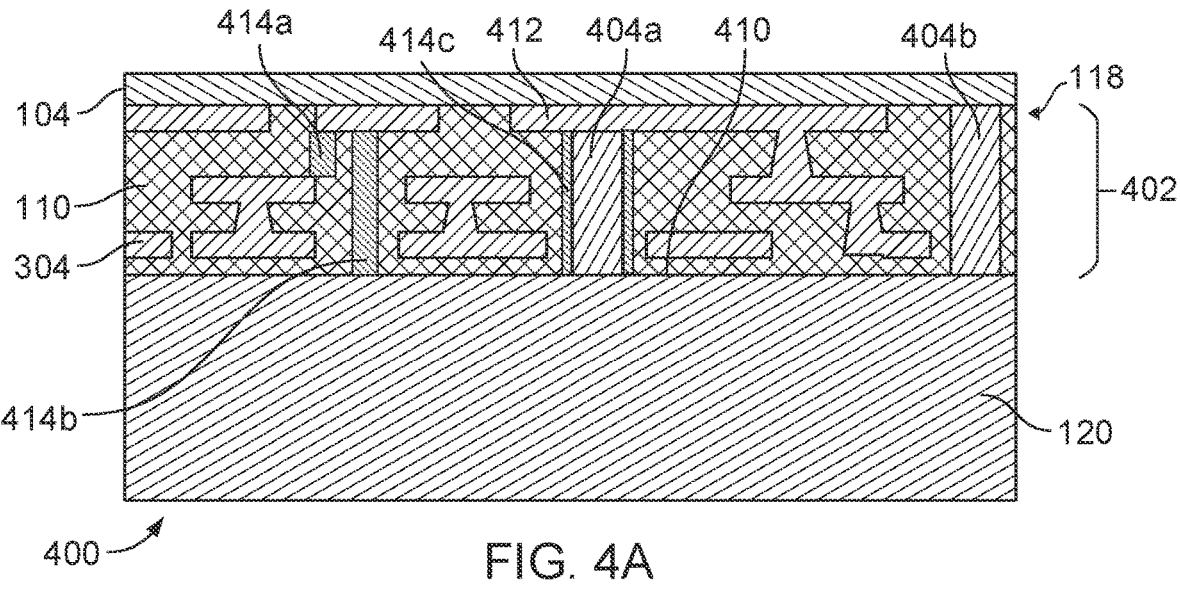
FIGS. 4A-4B are schematics illustrating examples of mechanical support structures.

When the filler material 110 has been removed, the circuit elements 304 may remain supported by a chain of via contacts and/or transmission lines (not shown in FIG. 3B) that is ultimately supported by the second substrate 120. However, this support may result in a mechanically weak multi-layer chip structure 320. In some implementations, to strengthen the structure (e.g., to allow for subsequent attachment of a second chip as described in reference to FIG. 1F), one or more mechanical support structures can be included in the circuit element layer stack 108. As shown in FIG. 4A, a structure 400 includes a circuit element layer stack 402 including a filler material 110, circuit elements 304, and support structures 404a, 404b. The support structures 404a, 404b extend vertically through multiple circuit element layers of the circuit element layer stack and can be formed during fabrication of the circuit element layer stack 402 as a whole. For example, when the structure 400 results from a process as described in reference to FIGS. 1A-1D, the support structures 404a, 404b can be formed when the circuit element layer stack 402 is fabricated on the first layer 104 on the first substrate 102. In some implementations, the structure 400 can result from a different fabrication process. For example, the circuit element layer stack 402, including the support structures 404a, 404b, can be formed on the second substrate 120, e.g., without use of the first substrate 102. While elements of the structure 400 can have characteristics as described for corresponding elements of FIGS. 1A-1F, the structure 400 need not be formed by the same or a similar process. The first layer 104 need not be included in the structure 400.

The support structures 404a, 404b extend through multiple circuit element layers of the circuit element layer stack 402. For example, support structure 404a extends from a surface 410 of the second substrate 120 to a circuit element 412 in an uppermost layer 118 of the circuit element layer stack 402 with respect to the second substrate 120 (e.g., adjacent to the first layer 104, when the first layer 104 is present). Support structure 404b extends from the surface 410 of the second substrate 120 to a structure directly above the circuit element layer stack 402, e.g., to the first layer 104.

The support structures 404a, 404b remain in the circuit element layer stack 402 when the filler material 110 is removed, supporting the circuit elements 304, the first layer 104 (if present), and/or an attached second chip, such as second chip 150 (if present). The support structures 404a, 404b can be formed of any one or more suitable materials that will not be removed in the removal process of the filler material 110. The materials are also mechanically robust to provide the mechanical support. For example, in some implementations the support structures 404a, 404b include poly-silicon or amorphous-silicon (a-Si), which will not be etched by an HF-based etch of the filler material 110 (e.g., silicon oxide). In some implementations, the support structures 404a, 404b include a superconductor material (such as any one or more of the superconductor materials described above), which can reduce loss for signals passing through the circuit elements 304, e.g., by reducing or eliminating resistive loss from current dissipation in the support structures 404a, 404b. In some implementations, the support structures 404a, 404b are formed of the same material as at least some of the circuit elements 304, e.g., a superconductor material. In some implementations, the support structures 404a, 404b are formed of a material having a coefficient of thermal expansion that matches or approximately matches a coefficient of thermal expansion of the second substrate 120, e.g., within 5%, within 10%, or within 20% of the coefficient of thermal expansion of the second substrate 120.

The support structures 404a, 404b can have dimensions suitable for providing mechanical support. For example, the support structures 404a, 404b can be columns with a lateral dimension (e.g., diameter or width) between 5 μm and 60 μm. In some implementations, this dimension is wider than a lateral dimension of via contacts that extend vertically through the circuit element layer stack 402 to interconnect transmission lines in different layers in the circuit element layer stack 402. For example, the via contacts may have a dimension (e.g., a diameter) of less than 5 μm, less than 10 μm, less than 20 μm, or less than 50 μm, and one or more of the support structures can have a dimension greater than one or more of these values.

In some implementations, support structures that serve at least a mechanical support function, such a support structures 404a, 404b, can be distinguished from via contacts, which serve a non-structural circuit function. For example, support structures may extend vertically through at least two, at least three, at least four, at least five, or at least six circuit element layers (e.g., in some cases, more circuit element layers than via contacts). In some implementations, the support structure is a single column extending through the layers. Support structures may extend vertically from the second substrate 120, while, in some implementations, circuit elements in the circuit element layer stack 402 are not in contact with the second substrate 120 (e.g., the filler material 110 may be between all circuit elements and the second substrate 120). In some implementations, the support structures are non-conductive while the via contacts are conductive or superconducting, or the support structures can be conductive but non-superconducting while the via contacts are superconducting. However, in some implementations, the support structures may further serve a circuit function, e.g., carrying signals between circuit element layers, and, as noted above, the support structures can be formed from the same material as the via contacts.

Figure 4B:
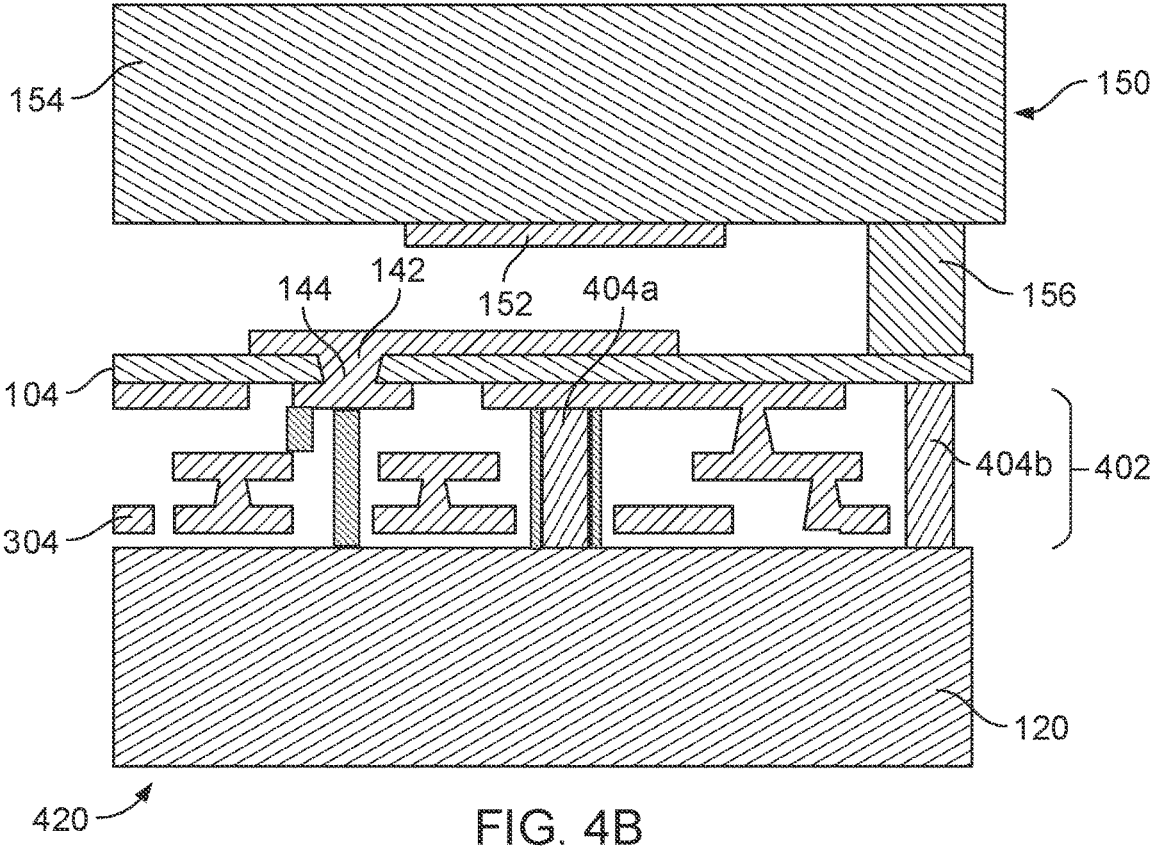

FIG. 4B shows an example two-chip structure including a first chip 420 and a second chip 150 (e.g., as described in reference to FIG. 1F). The first chip 420 can be formed from the structure 400 by selectively removing some or all of the filler material 110 and forming the device 142 (and, if not previously formed, the via contact 144). As previously described, a bump bond 156 joins the second chip 150 to the first chip 420. To support the weight of the second chip 150, in some implementations, one or more support structures (in this example, support structure 404*b*) can be arranged beneath the bump bond 156, aligned with the bump bond 156 (which is located at a bond point between the first chip 420 and the second chip 150). This arrangement provides mechanical support at the locations of the first chip 420 where the second chip 150 is supported, where mechanical stress may be concentrated. In some implementations, a mechanical support structure underlying a bump bond (e.g., support structure 404*b*) can be wider than a support structure not underlying a bump bond (e.g., support structure 404*a*).

The mechanical support structures can be arranged in any suitable pattern/configuration to support the circuit elements 304, the first layer 104, and/or the second chip 150. For example, the support structures can be arranged in an array, a ring, and/or another shape. In some implementations, the support structures are arranged in a ring around a boundary of the second substrate 120. In some implementations, the support structures are arranged more densely in portions of the circuit element layer stack 402 that include more circuit elements 304. For example, a first region of the circuit element layer stack 402 can include a higher density of circuit elements 304 than a second, separate region, and the first region can further include a higher density of support structures than the second region.

In some implementations, a circuit element layer stack includes one or more thermalization structures. A thermalization structure is arranged to provide a thermalization path for circuit elements such as circuit elements 304 and device 142, thermally coupling the circuit elements (which, in some implementations, should be maintained at low temperatures during operation, such as below a critical temperature) to another portion of the system that is well-connected to a cold thermal bath. Thermalization structures can be included in any of the structures described herein (e.g., structures 140, 204, 320, 400, 420 500, 510, 600, or 620) but can be particularly useful in circuit element layer stacks from which a filler material/sacrificial material is to be removed or has been removed, because the stack loses the thermalization that may be provided by the filler material/sacrificial material.

The thermalization structures can include one or more of: coatings on other elements/structures, the coatings composed of one or more thermalization materials; or independent structures, the independent structures composed of one or more thermalization materials. Thermalization materials are materials with a relatively high thermal conductivity at one or more relevant temperatures, such as room temperature and/or low temperatures compatible with superconductivity. In some implementations, the thermalization materials are non-superconductor materials. For example, non-superconductor metals such as gold, silver, and copper (and alloys thereof) can be used as thermalization materials. In some implementations, a thermalization material is a material with a high thermal conductivity, e.g., at least 10 W/mK or at least 100 W/mK at room temperature. Thermalization materials, in some implementations, are different from materials that are used for other elements of the circuit element layer stack, such as circuit elements (which, in some implementations, are formed of a superconductor material) and mechanical support structures (which, in some implementations, are formed of a superconductor and/or a dielectric material having a relatively low thermal conductivity, such as a nitride, an oxide, poly-silicon, or amorphous silicon).

For example, as shown in FIGS. 4A-4B, thermalization structures 414*a*, 414*b* formed of one or more thermalization materials, extends vertically through multiple layers of the circuit element layer stack 402. In some implementations, as shown here, the thermalization structure 414*a* is in contact with circuit elements in multiple layers. In some implementations, a thermalization structure extends through all layers of the circuit element layer stack. In some implementations, as shown here, the thermalization structure 414*b* is in contact with a substrate, such as second substrate 120. The substrate can in turn be well-coupled thermally to a cold thermal bath, so that the thermalization structure 414*b* and any elements in contact with or thermally coupled to the thermalization structure 414*b* are cooled through the substrate. The thermalization structures 414*a*, 414*b* are integrally formed of the one or more thermalization materials, e.g., are not thin coatings on another element/structure. In some implementations, the thermalization structures 414*a*, 414*b* are columns with a lateral dimension (e.g., diameter or width) between 5 μm and 60 μm.

As another example, thermalization structure 414*c* is a coating (e.g., a coating having a thickness of between 10 nm and 10 μm, such as between 100 nm and 5 μm) on mechanical support structure 404*a*. Accordingly, the combined structure including structures 404*a*, 414*c* both provides mechanical stability/strength (e.g., based on the dielectric material of the mechanical support structure 404*a*) and thermalization (e.g., based on the non-superconductor metal of the thermalization structure 414*c*).

In some implementations that include removal of filler material from a circuit element layer stack (with or without mechanical support structures in the circuit element layer stack), a passivation layer can be provided on surfaces of the circuit elements. In some cases, the passivation layer can protect the circuit elements from damage/etching in the process that removes the filler material. For example, when the circuit elements are formed of aluminum, an HF-based etch of the filler material may excessively etch the aluminum, absent protection by a passivation layer. Alternatively, or additionally, the passivation layer can reduce or prevent formation of undesired oxide layers on the surfaces of the circuit elements, reducing loss that would be caused by the oxide layers. For example, when the circuit elements are formed of aluminum, an aluminum oxide layer may form on the aluminum after removal of the filler material, absent protection by a passivation layer.

Figure 5A:
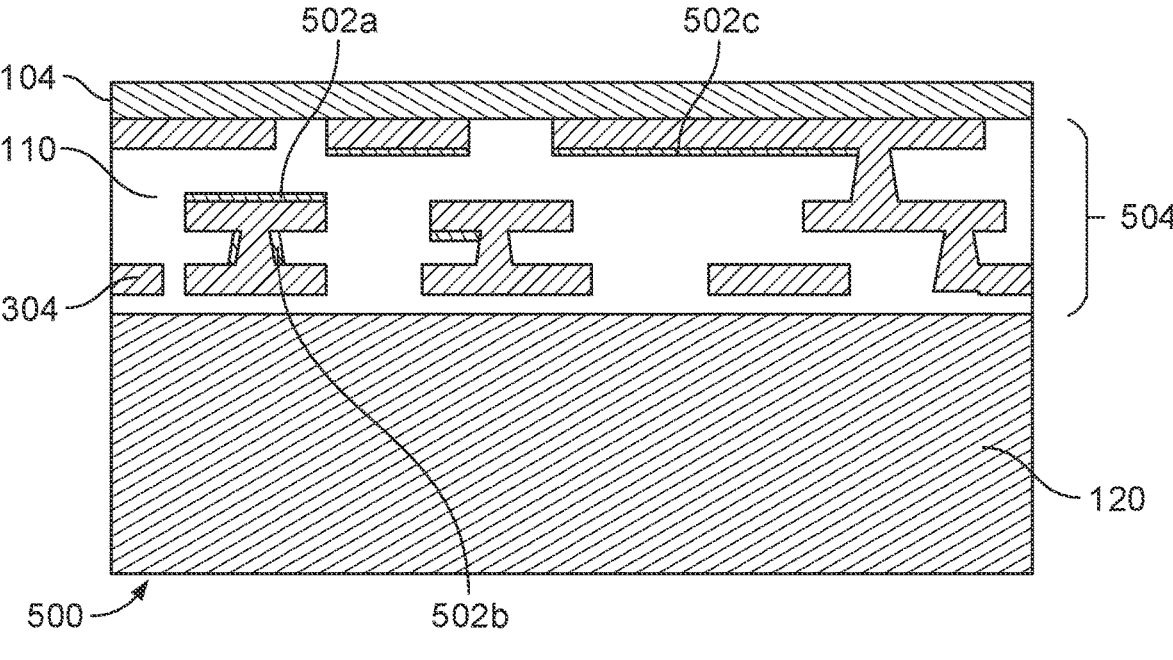
FIG. 5A is a schematic illustrating an example of a chip including circuit elements having passivation layers.

As shown in FIG. 5A, a structure 500 includes the second substrate 120, a circuit element layer stack 504, and a first layer 104. As described for structures 300 and 400, elements of the structure 500 can have characteristics as described for the structure 130, but the structure 500 need not be fabricated in the same way as the structure 130, and the structure 500 need not include the first layer 104. The structure 500 includes passivation layers, such as passivation layers 502*a*, 502*b*, 502*c* (referred to collectively as passivation layers 502), on at least some surfaces of at least some of the circuit elements 304. The passivation layers 502 can be formed during fabrication of the circuit element layer stack 504. For example, during a lithography and deposition process to form a transmission line, a passivation layer 502 can be deposited immediately before deposition of a material of the transmission line, such that the passivation layer 502 underlies the transmission line.

The passivation layers 502 can have various positions with respect to the circuit elements 304. In some implementations, the passivation layers coat a top surface of a circuit element, e.g., as illustrated for passivation layer 502a. In some implementations, the passivation layers coat a lateral surface, e.g., as illustrated for passivation layer 502b, which extends vertically along a lateral surface of a via contact. In some implementations, the passivation layers coat a bottom surface of a circuit element, e.g., as illustrated for passivation layer 502c. The underlying surfaces of the circuit elements 304 are protected by the passivation layer and, accordingly, do not form a substantial oxide layer when exposed to oxygen, e.g., in the atmosphere and/or during subsequent processing steps.

The passivation layers 502 can be formed of any suitable material that can, at least partially, remain in the circuit element layer stack 504 when the filler material 110 is removed. For example, the material(s) of the passivation layers 502 can be selected so that an etch that removes the filler material 110 is selective to the filler material 110 compared to the material(s) of the passivation layers 502. In some implementations, the passivation layers 502 are composed of an inert material, e.g., a noble metal such as palladium, platinum, or gold. The inert material can withstand etchants used to etch the filler material 110. Moreover, in some implementations, the passivation layers 502 are formed of a low-loss material that will not cause adverse or undesired levels of loss when signals are passed through the circuit elements 304. For example, the passivation layers 502 can be composed of a material with a low microwave loss tangent (e.g., a microwave loss tangent in a range as described for some implementations of the first layer 104) such that microwave signals carried by the circuit elements 304 will not be substantially absorbed by the passivation layers 502. In some implementations, the circuit elements 304 are composed of a superconductor material, and the passivation layers 502 are formed of a non-superconductor material, e.g., a non-superconductor metal. In some implementations, the passivation layers 502 are composed of an organic material, e.g., a low-loss polymer such as parylene or a low-loss organosilicon compound such as hexamethyldisilazane (HMDS).

In some implementations, the passivation layers 502 have one or more thermal properties that promote thermalization of the circuit element layer stack 504. For example, the passivation layers 502 can be formed of one or more thermalization materials (such as a non-superconductor metal, e.g., gold, silver, palladium, or platinum), in which case the passivation layers 502 can be thermalization structures as described above.

Figure 5B:
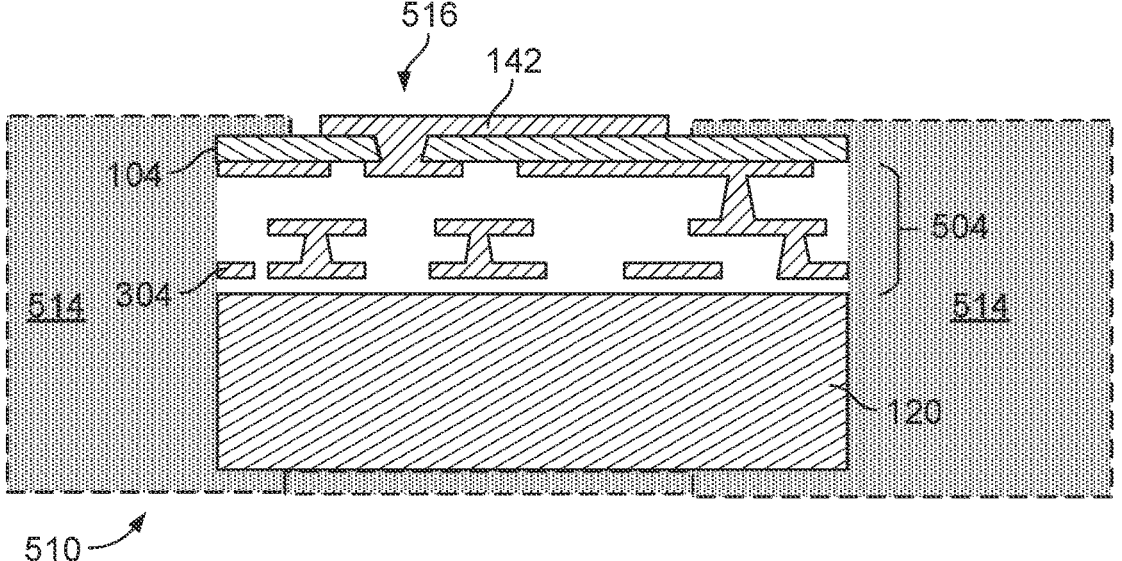
FIG. 5B is a schematic illustrating an example of a chip.

In some implementations, the passivation layers 502 are removed after removal of the filler material 110. For example, as shown in FIG. 5B, a chip 510 includes the circuit element layer stack 504 from which the passivation layers 502 have been removed. The chip 510 further includes packaging 514 (illustrated schematically) that substantially prevents entry of ambient oxygen into the interior of the circuit element layer stack 504, such that no substantial oxide forms on the bare surfaces of the circuit elements 304. The packaging 514 can include a polymer, a resin, or another suitable material coating at least a portion of the chip 510, e.g., a top, bottom, and/or side surface of the chip 510. As shown in FIG. 5B, the packaging 514 defines a region 516 in which the packaging is absent and through which the device 142 is exposed (e.g., to a vacuum or a gas), e.g., so that the device 142 can interact with device(s) on a second chip, e.g., device(s) directly facing the device 142 without intervening solid material, such as device 152. In some implementations, to form the chip 510 or another structure from which the passivation layer 502 has been removed, the passivation layer 502 is removed in an inert atmosphere. For example, the passivation layer 502 can be a layer (e.g., HMDS) that protects underlying circuit elements 304 during removal of the filler material 110. After removal of the filler material 110, a structure including the circuit element layer stack 504 is baked in an inert atmosphere to drive off the layer, leaving pristine surfaces of the circuit elements 304. The resulting structure is packaged in an inert atmosphere such that no oxide is formed on the surfaces of the circuit elements 304.

Figures 6A, 6B:
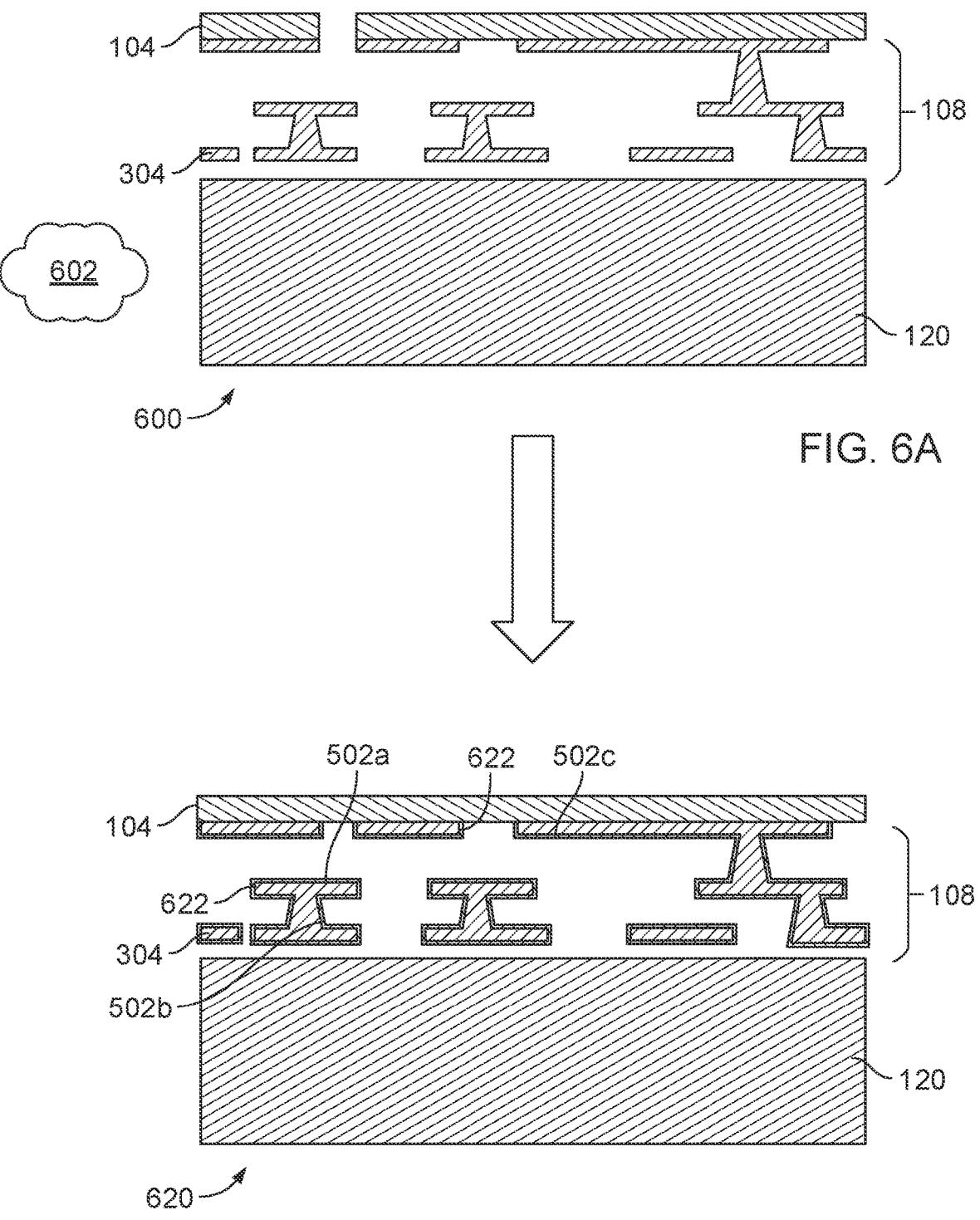
FIGS. 6A-6B are schematics illustrating an example of a fabrication process for passivation layer formation.

In some implementations, at least some of the passivation layers are formed after removal of the filler material. For example, as shown in FIG. 6A, a structure 600 includes the second substrate 120, a circuit element layer stack 108, and a first layer 104. As described for structures 300, 400, and 500, elements of the structure 600 can have characteristics as described for the structure 130, but the structure 600 need not be fabricated in the same way as the structure 130, and the structure 600 need not include the first layer 104. Filler material has been removed from the circuit element layer stack 108, and the structure 600 is kept in an inert atmosphere to prevent formation of an oxide layer on the circuit elements 304.

As shown in FIGS. 6A-6B, the structure 600 is exposed to a gas 602 that results in passivation layers 622 forming on exposed surfaces of the circuit elements 304. The gas 602 has a reactive chemistry that forms the passivation layers 622 by chemical deposition. For example, the gas 602 can include pyrolized parylene that is vapor-deposited onto the circuit elements 304 to form the passivation layers 622. The passivation layers 622 can have the characteristics described for passivation layers 502. In some implementations, forming the passivation layer by vapor deposition after removal of the filler material (e.g., rather than fabricating the passivation layer during fabrication of the circuit element layer stack) can advantageously allow the passivation layer to conformally cover all or nearly all exposed surfaces of the circuit elements 304, improving passivation.

The fabrication processes and structures described throughout this disclosure can be combined with one another in various ways. For example, the two-chip arrangement illustrated FIG. 1F (e.g., a two-chip arrangement of a qubit chip and a qubit control/readout chip) can include a circuit element layer stack from which a filler material has been removed (e.g., as described in reference to FIGS. 3A-3B), a circuit element layer stack that includes support structure(s) (e.g., as described in reference to FIGS. 4A-4B), and/or a circuit element layer stack that includes a passivation layer coating circuit element surfaces (e.g., as described in reference to FIGS. 5A-5B and 6A-6B).

The fabrication processes described herein can be applied to many different structures having many different combinations of materials and circuit elements/devices. For example, the fabrication processes illustrated by example in FIGS. 1A-2B are suitable at least for situations in which (i) a first portion of a chip is to be formed before a second portion of the chip, e.g., because of temperature/process limitations, and (ii) another element is to be formed on an opposite side of the first portion as the second portion, and also is to be formed (or attached to the chip) after the first portion of the chip is formed.

For example, in some examples of the process illustrated in FIGS. 1A-2B, the first portion is the first layer 104, the second portion is circuit elements in the circuit element layer stack 108, and the other element is the device 142 or the second chip 150. One example, discussed throughout this disclosure, is the application of the fabrication process to form a qubit control/readout chip. The qubit control/readout chip (e.g., first chip 140) includes, at or near its surface (e.g., surface 132), qubit control and/or readout elements (e.g., device 142) to couple coherently to qubits (e.g., second device 152) on a second chip (e.g., second chip 150). The qubit control/readout chip further includes buried circuit elements (e.g., circuit elements in the circuit element layer stack 108), such as transmission lines and via contacts, to carry signals to and/or from the qubit control and/or readout elements. The qubit control and/or readout elements and the buried circuit elements are at least partially formed of one or more superconductor metals. The qubit control and/or readout elements are disposed on a coherent device layer (e.g., the first layer 104) that has properties that facilitate a high-coherence coupling between the qubit control and/or readout elements and the qubits on the second chip. For example, the coherent device layer can be a single-crystal silicon layer having a microwave loss tangent in a range described above. To provide a layer having these properties, the layer is formed under high-temperature conditions that would be incompatible with the superconductor metals, such that the layer is formed before the qubit control and/or readout elements (and before the second chip is attached) and before the buried circuit elements. The qubit control and/or readout elements are formed on a first side of the layer, and the buried circuit elements are formed on a second, opposite side of the layer. The circuit element layer stack 108 can include a sacrificial material, such as silicon oxide or silicon nitride, that is removed, e.g., by etching. The circuit element layer stack can include one or more mechanical support structures that support circuit elements of the circuit element layer stack and/or the coherent device layer, e.g., to support bump bonds on the coherent device layer. For example, the mechanical support structures can be formed of a superconductor material.

A number of implementations have been described. Nevertheless, it will be understood that various modifications may be made. Elements of one or more implementations may be combined, deleted, modified, or supplemented to form further implementations. In yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for fabricating a qubit control chip, the method comprising:

providing a first substrate having a first layer on a surface of the first substrate, wherein the first layer has a dielectric loss tangent for microwave frequencies of less than $10^{-5}$;

forming a plurality of layers into a circuit element layer stack on a first surface of the first layer, wherein the circuit element layer stack comprises a plurality of circuit element layers, wherein the plurality of circuit element layers comprises a plurality of circuit elements, wherein the plurality of circuit elements comprise a superconductor material;

after forming the plurality of layers into the circuit element layer stack on the first layer, bonding a second substrate to a surface of the circuit element layer stack, wherein the surface of the circuit element layer stack is on an opposite side of the circuit element layer stack from the first layer;

after bonding the second substrate to the surface of the circuit element layer stack, removing the first substrate to expose a second surface of the first layer, the second surface being on an opposite side of the first layer from the first surface; and forming a qubit control element or a qubit readout element on the second surface of the first layer.

2. The method of claim 1, wherein the second substrate, the circuit element layer stack, the first layer, and the qubit control element or the qubit readout element are included in a first chip, and wherein the method comprises:

bonding a second chip to the first chip with the qubit control element or the qubit readout element facing the second chip, wherein the qubit control element or the qubit readout element is separated from the second chip by a gap.

3. The method of claim 2, wherein the second chip comprises a qubit arranged to couple to the qubit control element or the qubit readout element.

4. The method of claim 1, comprising:

forming a via through the first layer, the via electrically coupling the qubit control element or the qubit readout element to a first circuit element of the plurality of circuit elements.

5. The method of claim 4, wherein forming the via through the first layer comprises:

subsequent to removing the first substrate, forming an aperture in the first layer; and forming the via in the aperture.

6. The method of claim 4, wherein forming the via through the first layer comprises, prior to bonding the second substrate to the surface of the circuit element layer stack:

forming an aperture in the first layer from the first surface of the first layer; and forming the via in the aperture.

7. The method of claim 1, wherein bonding the second substrate to the surface of the circuit element layer stack comprises:

forming a first metal layer on a surface of the second substrate;

forming a second metal layer on the surface of the circuit element layer stack; and bonding the first metal layer to the second metal layer.

8. The method of claim 1, wherein the first substrate comprises a dielectric layer between the surface of the first substrate and the first layer, and wherein removing the first substrate further comprises removing the dielectric layer.

9. The method of claim 1, wherein removing the first substrate comprises etching the first substrate.

10. The method of claim 1, comprising:

transferring a structure comprising the circuit element layer stack, the first layer, and the second substrate from a first fabrication tool to a second fabrication tool or within a fabrication tool, wherein transferring the structure comprises contacting the second substrate.

11. The method of claim 1, wherein the circuit element layer stack comprises a filler material filling a space between the plurality of circuit elements.

12. The method of claim 1, wherein the circuit element layer stack comprises a thermalization structure composed of one or more non-superconductor metals.

13. The method of claim 1, wherein the first layer is a monocrystalline silicon layer.

14. The method of claim 2, wherein the first layer is a monocrystalline semiconductor layer, and wherein the first substrate comprises an intermediate layer in contact with the second surface of the first layer, wherein the intermediate layer comprises a dielectric material.

15. The method of claim 1, wherein forming the plurality of layers into the circuit element layer stack on the first surface of the first layer comprises performing, on the plurality of layers while the plurality of layers are on the first surface of the first layer:

at least one of physical layer deposition or chemical deposition;

at least one of photolithography or electron-beam lithography; and at least one of wet-chemical etching or plasma etching.

* * * * *